United States Patent
Fera

(12) 
(10) Patent No.: US 6,405,147 B1
(45) Date of Patent: Jun. 11, 2002

(54) SIGNAL TRANSFER DEVICE MEASUREMENT SYSTEM AND METHOD

(75) Inventor: Peter P. Fera, Saratoga, CA (US)

(73) Assignee: Condor Systems, Inc., Morgan Hill, CA (US)

( * ) Notice: Subject to any disclaimer, the term of this patent is extended or adjusted under 35 U.S.C. 154(b) by 0 days.

(21) Appl. No.: 09/393,408

(22) Filed: Sep. 10, 1999

(51) Int. Cl.[7] .................................................. H04B 1/62
(52) U.S. Cl. ....................... 702/112; 702/108; 702/182; 702/57; 702/70; 702/75
(58) Field of Search ........................... 702/57, 58, 59, 702/62, 66, 70, 71, 72, 74, 75, 79, 108–112, 116, 117, 122, 124–126, 182, 183, 185, 188, 189, 103, FOR 104, 107, 110, 134, 135, 170, 171; 324/763, 764, 158.1, 607, 76.22, 76.47; 375/225; 714/699

(56) References Cited

U.S. PATENT DOCUMENTS

| | | | |
|---|---|---|---|
| 4,135,057 A | * 1/1979 | Bayless, Sr. et al. | 375/280 |
| 4,417,349 A | * 11/1983 | Hills et al. | 375/60 |
| 4,507,794 A | * 3/1985 | Jones et al. | 375/55 |
| 4,672,632 A | * 6/1987 | Andersen | 375/57 |
| 4,980,687 A | * 12/1990 | Newell et al. | 341/157 |
| 5,068,874 A | * 11/1991 | Leitch | 375/51 |
| 5,202,900 A | * 4/1993 | Leitch | 375/51 |
| 5,253,270 A | * 10/1993 | Petit | 375/43 |
| 5,420,516 A | * 5/1995 | Cabot | 324/620 |
| 5,475,315 A | 12/1995 | Cabot | 324/628 |
| 5,649,304 A | * 7/1997 | Cabot | 455/67.4 |
| 5,748,001 A | * 5/1998 | Cabot | 324/624 |
| 5,749,047 A | 5/1998 | Cabot | 455/67.4 |
| 5,809,080 A | * 9/1998 | Karabed et al. | 375/263 |
| 5,818,240 A | * 10/1998 | Cabot | 324/626 |
| 5,937,006 A | * 8/1999 | Clark et al. | 375/224 |
| 5,995,914 A | * 11/1999 | Cabot | 702/109 |
| 6,064,694 A | * 5/2000 | Clark et al. | 375/224 |
| 6,243,427 B1 | * 6/2001 | Stockton et al. | 375/308 |

* cited by examiner

*Primary Examiner*—Marc S. Hoff
*Assistant Examiner*—Carol S. Tsai
(74) *Attorney, Agent, or Firm*—North Shore Associates; J. Michael Johnson; Elizabeth E. Leitereg

(57) ABSTRACT

A signal transfer device measurement system and method of the present invention measures the signal transfer characteristics of a device under test (DUT) having an analog input port and either an analog output port or a digital output port. The measurement system and method comprise a stimulus waveform generator that produces a stimulus waveform. The stimulus waveform comprises a time sequence of pairs of narrow bandwidth, modulated signals. The stimulus waveform is applied to the input port of the DUT thereby producing an output response signal at the output port of the DUT. For a DUT with an analog output port, the measurement system and method further comprise an analog-to-digital converter (ADC) for digitizing the output response signal and producing digital data and a signal processor for processing the digital data thereby producing measured results. For a DUT with a digital output port that produces digital data representing the DUT response, an ADC of digitizing is eliminated from the measurement system and method. In the preferred embodiment, the each pair of signals of the sequence of pairs of narrow bandwidth, modulated signals of the stimulus waveform comprises a reference frequency modulated signal and a variable frequency modulated signal, wherein a variable carrier frequency is varied from pair to pair in the sequence of pairs. Moreover, the reference frequency modulated signal and the variable frequency modulated signal are each double sideband, suppressed carrier, modulated signals modulated with a low frequency modulation signal.

11 Claims, 10 Drawing Sheets

SIGNAL TRANSFER DEVICE MEASUREMENT SYSTEM AND METHOD

BACKGROUND OF THE INVENTION

1. Field of the Invention

The present invention relates to a method and system for the accurate measurement of a transfer function or of signal transfer characteristics of signal transfer systems. In particular, this invention relates to a system and method that provide precision characterization of the amplitude and phase response of signal transfer devices, systems and channels.

2. Description of the Related Art

Modem analog, digital and mixed signal communication and radar systems can be classified generally as signal transfer devices, systems or channels. These systems transfer information in the form of a signal waveform from an input to an output. A signal is introduced into the system at an input. The signal passes through the components of the system and exits the system at an output. The information content of the signal is then extracted from the output signal by some appropriate means.

In the case of a typical communication system, a signal containing the information content or message to be communicated is introduced into the input of the system often called a transmitter. The signal exits the transmitter and passes through some type of communication channel such as a cable, the air, or possibly empty space to a receiver. The signal then passes through the receiver and is measured at the receiver's output to determine the message or information content of the signal. When viewed as a whole, the communication system comprised of the transmitter, communication channel and receiver is simply a device or channel for transferring the signal from the input to the output of the system.

Likewise, RADAR systems are essentially signal transfer devices. RADAR operates in a manner completely analogous to a communication system except that in the radar system the transmitter and receiver are often co-located and the information content of the signal is the effect that the radar's target has on the transmitted signal and not the signal itself. Still, the signal that is received contains information that is extracted at the RADAR receiver output.

The designer of signal transfer systems usually assumes that the components that make up the system are ideal, linear and time-invariant. The components are assumed to be ideal in the sense that they have a given amplitude and phase response over a given frequency range known as their operational band. The term linear means that the output and input of the devices are related by a linear function known as a transfer function, and time-invariant means that the transfer function is not a function of time. The amplitude and phase versus frequency characteristic of a device or channel is also called the spectrum or spectral response of the device or channel.

A deviation from the expected transfer function of a signal transfer system is generically known as distortion. The signal is distorted by the system. Distortion interferes with the accuracy of the signal transfer and generally increases the chances that the information content of the signal waveform will be corrupted. The corruption of the waveform by its passage through the system increases the chance that errors will be made in its interpretation at the output of the system. Sufficient errors can render a signal and the associated signal transfer system of little or no practical use.

Although systems are generally designed assuming that the components from which the system is constructed are ideal, it is impossible to manufacture ideal components; all real components are only approximations of the ideal components used in the design. The manufacturing goal is to produce components that are standardized within a given tolerance at an acceptable cost. Even if a given component is close enough to a given standard when manufactured, the component may change over time, thereby deviating from the standard. Components deviate from the desired performance characteristics both in terms of their individual complex frequency or spectral response and from unit to unit.

The signal path that connects the waveform source and receiver, be it wire, fiber optic cable or empty space, also can and does behave in a non-ideal manner. Therefore, the non-ideal characteristics of the channel will introduce distortion in the signal being transferred through the system. This distortion is in addition to the distortion introduced by the non-ideal components used to construct the system.

The non-ideal nature of manufactured components and the interconnecting channel leads to the need for obtaining precise measurements of the transfer functions that make up a system. The measurements provide data which can be used to accept or reject components, adjust the performance of the component or, in some cases, to equalize the component's or channel's non-ideal performance. Equalization is normally accomplished through the use of an equalizer designed from measurements of the non-ideal performance that is inserted into the signal path of the system. The ultimate performance of the signal transfer system is, therefore, integrally related to the ability to measure the system performance.

An example where precise measurement and subsequent equalization of system signal transfer characteristics are often required is matching multiple independent receiving channels for angle of arrival or antenna array applications. In general, individual receiver channels will have variations in their signal transfer characteristics resulting from normal manufacturing tolerance variations. These variations will directly effect the performance and accuracy of the system of multiple receivers and render the system unusable. However, if the transfer characteristics can be measured for each receiver channel with sufficient accuracy, a set of equalizer filters can be designed and placed in each receiver to effectively eliminate the variations between channels. Generally, the equalizers are used to flatten out the amplitude versus frequency variations and linearize the phase response of the individual channels as well as minimize the absolute differences between channels. Therefore, the precision of the signal transfer function measurement is an important consideration since it is these measurements that are used to create the equalizer designs.

In some cases such as modern communications systems that employ so called predistortion techniques to maximize data throughput, equalization is used to produce a transfer function that has neither a flat amplitude versus frequency characteristic nor a linear phase response. Precise measurement of the transfer characteristics of such systems is generally required to insure that the desired transfer function has been achieved by the designed equalizer as well as to provide necessary data for designing the equalizers. This is particularly true for systems that utilize wide bandwidth signals whose modulation features are particularly affected by slight undesired variations of group delay versus frequency response of the channel from a desired standard response.

The conventional technique for measuring the performance of a signal transfer system or channel is illustrated in FIG. 1. A signal source or signal generator 12 is used to generate a known stimulus signal. The stimulus signal thus generated is divided into two copies one of which is applied to an input of the system or device under test (DUT). The other copy of the stimulus signal bypasses the DUT and is collected by a signal measurement processor 16. An output signal of the DUT produced in response to the applied stimulus signal is also collected by the signal measurement processor 16. In the signal measurement processor 16, the output signal of the DUT is compared to the copy of the stimulus signal that bypassed the DUT. The comparison in the signal measurement processor 16 of these two signals is used to determine the transfer function of the DUT. Since all systems have an associated time delay, this time delay as a function of frequency must be taken into account if an accurate transfer function is to be determined. The signal measurement processor may be either an analog system or a digital system. The digital systems are based on an analog-to-digital converter combined with either a digital signal processor or computer with digital processing software.

The complex transfer function, $H(j\omega)$, of a linear system is then computed in the measurement processor 16 from the ratio of output spectrum, $G(j\omega)$, to input stimulus function $S(j\omega)$ as $$H(j\omega) = \frac{G(j\omega)}{S(j\omega)}$$

The stimulus signal generated by the signal source or generator 12 must contain sufficient energy across the frequency spectrum of interest to accurately characterize the transfer function. The accuracy in computing the transfer function depends on the accuracy with which the output spectral response can be measured, and the accuracy of the knowledge of the stimulus function.

Generally, conventional measurement systems differ in terms of their type of stimulus signal and the means of comparing the input and output signals. The two most common stimulus signals utilized by conventional measurement systems are a wideband swept or chirped frequency modulated (FM) signal and a pseudo-noise (PN) spread spectrum waveform. The chirped FM signal consists of a sine wave, the frequency of which is varied with time such that the operational band of the DUT is covered. Although not necessary, the chirped FM signal often is generated by linearly increasing the frequency of the sine wave from some low frequency, $f_l$, to some higher frequency, $f_h$, such that the transition from $f_l$ to $f_h$ occurs over some fixed time interval t. The chirped FM signal when used as a stimulus signal effectively tests the DUT over the frequency range spanned by $f_l$ and $f_h$. In the case of the PN spread spectrum waveform, the goal is to generate a noise-like signal that has frequency components that span the $f_l$ to $f_h$ frequency range. By observing the difference between the input and output signals for a sufficiently long period of time, the entire frequency response of the DUT can be computed from the measured data.

A third type of stimulus waveform consists of a plurality of sinusoids at fixed discrete frequencies spanning the frequency band of interest. This approach to signal transfer device measurement is exemplified in U.S. Pat. No. 5,475,315 issued to Cabot. As with the other two conventional techniques, this method implicitly depends on the comparison of the plurality of sinusoids before and after passing through the DUT. In addition, the technique described by Cabot introduces such a large number of discrete frequency waveforms so as to make it very difficult to detect and separate out the harmonic distortion components generated by the non-ideal performance of the DUT. Furthermore, the output power is shared among the plurality of sinusoids, thereby reducing the available output signal-to-noise ratio of any one of them. This reduced signal-to-noise ratio limits the measurement accuracy of the transfer function at the frequency of the sinusoid.

The conventional measurement systems for determining the complex transfer function of signal transfer devices generally employ stimulus waveforms which are difficult to generate, require careful calibration of the stimulus, and often do not allow discrete spectral sampling. In addition, the conventional systems often have limited dynamic range or sensitivity that results in severe limitation in the accuracy of the data obtained.

Therefore, it would be desirable to have a signal transfer device measurement system and method that did not require a copy of the stimulus signal that bypassed the DUT and did not require direct calibration by the stimulus signals as in the conventional systems. Further, it would be desirable if such a measurement system and method employed an easily generated stimulus signal and yielded measurements of arbitrarily high accuracy and precision. Such a measurement system would overcome a long-standing problem in the area of signal transfer device measurement technology.

SUMMARY OF THE INVENTION

In accordance with this invention the shortcomings of existing, conventional measurement systems are overcome with a novel method and system that measure the complex transfer function of baseband and bandpass signal transfer devices or systems (DUTs). The present invention produces accurate and precise measurements of the transfer characteristics of a signal transfer device, channel or system that can be used to determine an accurate transfer function of the device. Furthermore the method and system of the present invention provide measurements of the transfer function of the DUT with sufficient accuracy and resolution to support the effective design of equalization filters for the correction of DUT distortions and/or the precision tuning of the DUT for the purpose of reducing or eliminating these distortions.

The signal transfer device measurement system and method of the present invention measures the characteristics of a DUT having an analog input port and an analog or a digital output port. The measurement system comprises a stimulus waveform generator that produces a stimulus waveform wherein the stimulus waveform comprises a time sequence of pairs of narrow bandwidth, modulated signals. The stimulus waveform is applied to the analog input port of the DUT thereby producing an output response signal at the output port of the DUT. In the case of a DUT with an analog output port, the measurement system further comprises an analog-to-digital converter (ADC) for digitizing the output response signal and producing digital data. When the DUT has a digital output port, the present system does not include an ADC. The measurement system in both cases further comprises a signal processor for processing the digital data produced either by the ADC or by the DUT itself into measured results.

The time sequence of pairs of signals of the stimulus waveform comprises a fixed frequency or reference frequency modulated signal, and a variable frequency modulated signal. The reference frequency modulated signal is a double sideband, suppressed carrier, modulated signal having a reference carrier frequency, wherein the reference frequency modulated signal is modulated by a low frequency modulation signal. Similarly, the variable frequency modulated signal is a double sideband, suppressed carrier, modulated signal having a variable carrier frequency, wherein the variable frequency modulated signal is modulated by the low frequency modulation signal, and wherein said variable carrier frequency is variable from pair to pair in the sequence of pairs. In the preferred embodiment, the low frequency modulation signal is a sine wave and the stimulus waveform generator is an arbitrary waveform generator.

The waveform at the analog output of the DUT is captured by digitizing and storing the waveform in a digital memory of the signal processor. The waveform at the digital output of the DUT is captured by simply storing it in the digital memory of the signal processor. A sample of the output waveform is captured during each frequency step of the variable stimulus signal. The collection of captured waveforms is processed once the variable frequency stimulus signal has been stepped across the entire frequency band of interest. The collection of captured waveforms constitutes the raw time-sampled data from which a complete transfer function for the DUT is computed by methods of the invention. The processing performed by the signal processor consists of a transformation of the collected data into one or more of the more conventional measures of the DUT performance embodied by a complex transfer function. Such data as the DUT transfer function magnitude, phase and group delay relative to the reference frequency stimulus signal output are readily extracted by this processing. Accuracy and precision of the resulting measured data is related the frequency step size of the variable stimulus signal, the length of the dwell time at each frequency step and the digitizer precision.

The advantages of the present invention over that of the conventional measurement systems include the ease of stimulus waveform generation, ease of stimulus calibration, the possibility of discrete spectral sampling, arbitrarily high accuracy and sensitivity, automatic time synchronization and uniform spectral stimulation.

The stimulus waveform generator of the present invention can be implemented with commonly available hardware components or arbitrary waveform generators. No complicated digital pseudo-noise or ultra-linear frequency modulation chirp waveforms are required.

The present invention makes it relatively easy to verify the stability and accuracy of the stimulus waveform using conventional, readily available laboratory instruments such as spectrum analyzers or other continuous waveform analyzers. Such calibration of the stimulus is sometimes necessary for accurate comparison to the receiving channel output in response to the stimulus. This is in contrast to the conventional methods that use direct sequence spread spectrum or FM chirp stimulus waveforms whose precise calibration of magnitude and phase versus frequency is more difficult to measure or verify because of their large instantaneous bandwidths.

Each waveform in the set of stimulus waveforms in the present invention is used to measure a single point at a discrete frequency of the DUT transfer function. The conventional measurement techniques employ waveforms that may occupy a continuum of spectrum or a multiplicity of discrete spectral frequencies making precise, measurement at discrete frequencies difficult or impossible. In addition, in the measurement system of the present invention, any distortion products of the DUT due to non-linearities or other non-ideal characteristics are also at discrete, and more importantly, at predictable discrete frequencies separate and distinct from the desired output frequency products. This separation of the distortion products from those of the desired frequency response of the DUT facilitates highly accurate measurement of the desired frequency components and imparts a natural immunity from distortion product interference in the analysis process. In the conventional methods that use continuous spectrum stimulus signals such as FM chirp and PN sequence methods the distortion products are difficult or impossible to separate from the desired components and result in errors in the measurements.

The method and system of the present invention permit high accuracy measurements of both amplitude and phase versus frequency. Of these two measurements, the accuracy of the phase measurement afforded by the present invention is possibly the most important and significant result. This is particularly true for devices with limited dynamic range or limited output signal-to-noise ratio (SNR). Since all of the waveform energy of a given stimulus waveform resides at several known discrete frequencies, a discrete Fourier transform (DFT) spectral analysis of the output results in a high SNR at these discrete frequencies. The DFT is normally implemented using a fast Fourier transform (FFT). The duration of each waveform can be chosen to be virtually as large as desired, thus increasing the SNR of the signals in the frequency cells of the FFT. The error in computation of magnitude and phase due to noise is thus made arbitrarily small compared to the conventional techniques. Magnitude error of less than 0.03 dB RMS and phase error of less than 0.1 degrees RMS are typically achieved in practice with the present invention.

The waveforms of the present invention are self-synchronizing and self-referencing. No phase or timing reference between the stimulus generator and the output waveform capture digitizer are required except that the digitizer must capture the output waveform while it is present and for the desired duration. Amplitude and group delay distortion are measured relative to a frequency response near the center of the DUT with the present invention. Most conventional techniques require the direct comparison of the input stimulus to the output stimulus necessitating a direct connection between the stimulus source and the output measurement system. Other techniques require the input and output frequencies to be the same, or require a precise time reference relating the output waveform to the input waveform.

Moreover, each of the stimulus waveforms at each frequency step is generated independently from the others. Thus, the amplitude can be easily adjusted to ensure that waveform at each frequency step have virtually the same magnitude. In contrast, the conventional techniques often generate wideband stimulus waveforms whose magnitude versus frequency is described by a sinc (sin(x)/x) function or similar function. Such non-uniform spectral power density causes output SNR to vary similarly, causing variation in measurement errors versus frequency.

BRIEF DESCRIPTION OF THE DRAWINGS

The various features and advantages of the present invention may be more readily understood with reference to the following detailed description taken in conjunction with the accompanying drawing, where like reference numerals designate like structural elements, and in which.

DETAILED DESCRIPTION OF THE PREFERRED EMBODIMENTS

Figure 1:
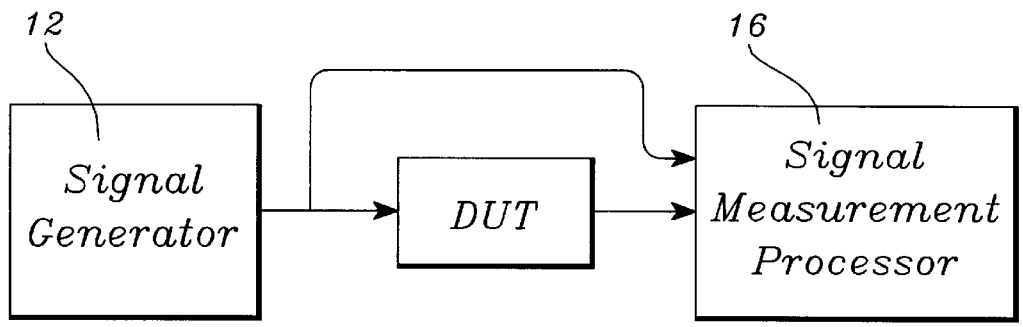
FIG. 1 illustrates a block diagram of a conventional measurement system.
Figure 2:
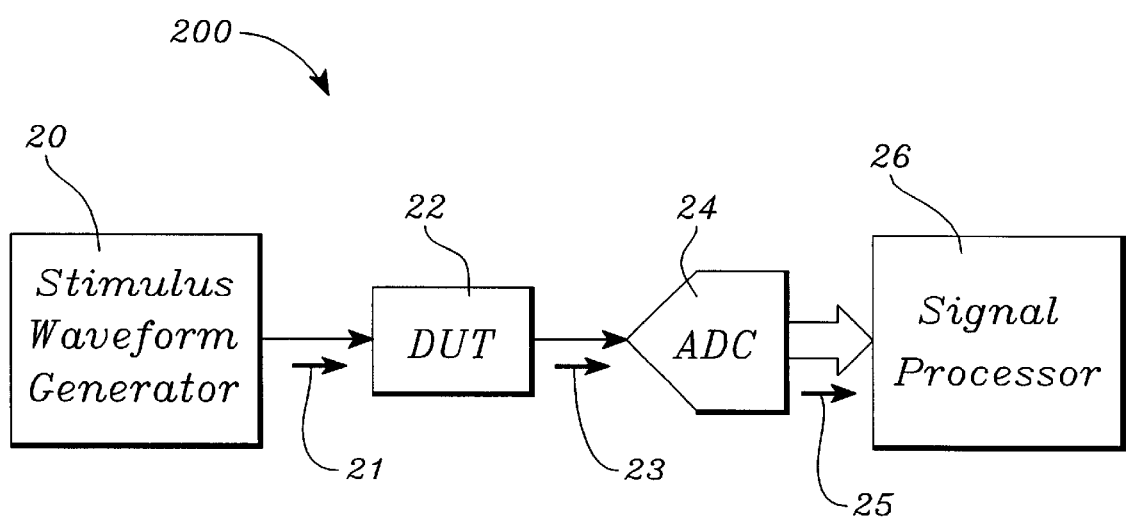
FIG. 2 illustrates a block diagram of one embodiment of the measurement system of the present invention.

A block diagram of one embodiment of the signal transfer device measurement system of the present invention is illustrated in FIG. 2. The signal transfer device measurement system 200 of the present invention is used to measure the signal transfer devices DUT 22 that have analog inputs and analog outputs. The system 200 comprises a stimulus waveform generator 20 that produces an analog stimulus waveform or signal 21. The analog stimulus waveform 21 is applied to an input port of a device under test (DUT) 22. The DUT 22 produces an output signal at an output port as a result of or in response to the application of the stimulus waveform 21. The system 200 further comprises an analog-to-digital converter (ADC) 24. The ADC 24 samples and digitizes the output signal 23 from the DUT 22 to produce a sampled data sequence 25. The system 200 still further comprises a signal processor 26. The sampled data sequence 25 is stored and processed by a signal processor 26. The signal processor 26 produces output data and measurement results that include but are not limited to the measurement of phase and amplitude of a complex transfer function of the DUT 22. Among the advantages of the measurement system 200 of the present invention are that the spectral resolution and measurement precision of the output data are selectable and controllable characteristics. Additionally, the accuracy of the transfer function measurements at discrete frequencies produced by the operation of the present invention is predictable. In particular, the measurement system 200 of the present invention is capable of producing output data with sufficient precision to enable, among other things, the design of equalizers for the compensation of signal distortions introduced by the DUT 22.

The measurement system 200 is useful for measuring transfer functions and related measurements of a DUT 22 that is made up of any linear, time-invariant (LTI) device, channel or system that is classifiable as a signal transfer device as described hereinabove. When used herein, the word, "time-invariant" means that the device transfer characteristics should not change for a period of time that is at least long as the time required to complete the measurement of the device. As will be described in more detail below, the time required to complete a measurement of a given DUT 22 is proportional to the bandwidth of the DUT 22 and the desired measurement spectral resolution.

Moreover, the present measurement system 200 is useful for measuring transfer functions and related measurements of a DUT 22 that include weakly non-linear signal transfer devices in addition to a strictly linear device. Weakly non-linear signal transfer devices produce a fundamental spectral product or output signal as well as number of harmonic and intermodulation distortion products or output signals in response to the application of a stimulus waveform. A feature of the present invention is that the harmonic and intermodulation distortion products typically associated with the operation of weakly non-linear devices are easily distinguishable from the linear or fundamental product needed for processing in the signal processor 26. Consequently these non-linear distortion products can be readily removed during processing and do not interfere with the principle operation of the present system 200. In a preferred embodiment the non-linear distortion products associated with the DUT 22 with weakly non-linear characteristics should be at least 20 dB below the fundamental product at the output of the DUT 22 for optimum performance of the measurement system 200 of the present invention.

In addition, the present system 200 is useful for measuring transfer functions and related measurements of a DUT 22 in which a frequency translation takes place. For example, an output frequency, $f_{out}$, that is present at the output of this DUT 22 generally is related to an input frequency, $f_{in}$, of the stimulus waveform 21 applied to the input of the DUT 22 by the equation $$f_{out} = L \pm f_{in} \qquad (i)$$

where L is a constant frequency offset. The presence of the "±" allows for spectral inversion of an output spectrum associated with a spectrum of the stimulus waveform 21. In the case where there is no translation in the DUT 22, L is equal to zero; otherwise, L has a fixed value in Hz. One of ordinary skill in the art will also recognize that the frequency offset L defined above may be partially associated with the type of sampling used by the ADC 24 as well as the DUT 22 itself. An example of this is so called "bandpass" sampling in which an effective frequency translation occurs during sampling. Nevertheless, if L is considered the effective offset, an appropriate L can be identified that includes all frequency translations whether actual or effective and equation (i) will adequately account for all situations.

Figure 3:
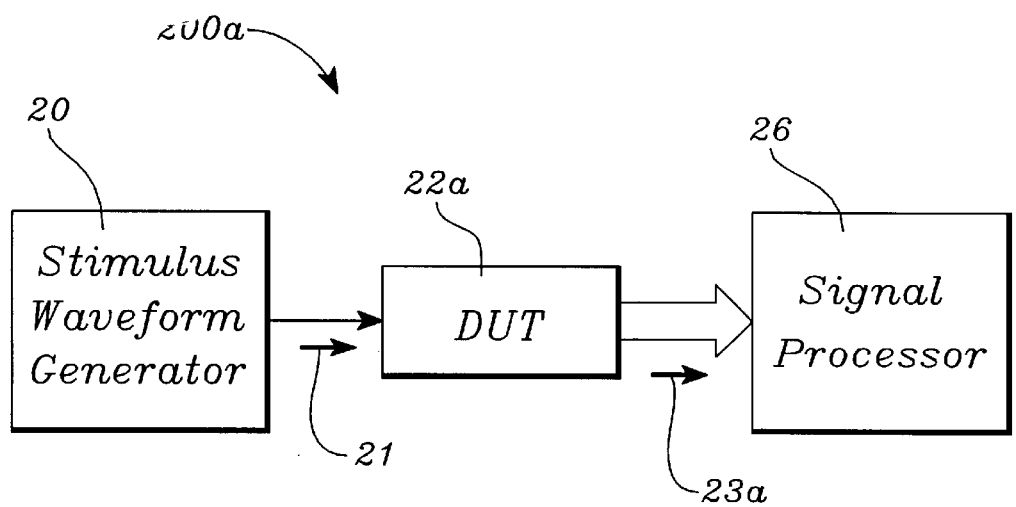
FIG. 3 illustrates a block diagram of an another embodiment of the measurement system of the present invention in which the device under test has an analog input and a digital output.

FIG. 3 illustrates another embodiment of the measurement system 200a of the present invention that is used to measure signal transfer devices DUT 22a in which an analog-to-digital converter is incorporated in the DUT 22a. Therefore, the ADC 24 that is incorporated into system 200 is not necessary in the system 200a. The measurement system 200a comprises the stimulus waveform generator 20 that generates the stimulus signal 21 that was described above for system 200. The stimulus signal 21 is applied to the input port of the DUT 22a. The DUT 22a produces a sampled data sequence 23a analogous to the sequence produced by the ADC 24 of the system 200 as an output at its output port. The sampled data sequence 23a of the DUT 22a is stored and processed by the signal processor 26 as in the system 200 embodiment.

When the DUT 22a incorporates an analog-to-digital converter (ADC), performance of the ADC is measured along with that of the signal transfer devices that precede the ADC by the system 200a of the present invention. Since the operation of analog-to-digital converters is often less than ideal, system 200a of the present invention produces output data that advantageously facilitates the design of equalizers that compensate for the non-ideal ADC operation as well as non-ideal performance of the preceding signal transfer devices. Unless otherwise noted, all discussion below applies equally well to either system 200 with the DUT 22 or system 200a with DUT 22a. Therefore, also unless otherwise noted, DUT 22 hereinafter refers to both DUT 22 and DUT 22a and system 200 hereinafter refers to system 200 and system 200a.

The stimulus waveform generator 20 produces a stimulus waveform 21 that is comprised of a time sequence of amplitude-modulated, analog signals. In particular, the stimulus waveform 21 is comprised of a plurality of time sequence pairs of double sideband, suppressed carrier, modulated signals. The waveform generator 20 produces a first pair of signals followed by a second pair and so on until all pairs of signals have been produced. Each pair of signals is produced for a specified time duration, $T_D$.

Each pair of signals in the time sequence, comprises a first modulated signal called a reference frequency stimulus signal, $S_r$, and a second modulated signal referred to herein as a variable frequency stimulus signal, $S_v$. The reference frequency stimulus signal, $S_r$, of each pair has a reference carrier frequency, $f_r$. Normally, the reference carrier frequency $f_r$ of the signal $S_r$ is chosen such that it is at or near a center frequency, $f_c$, of an operational band of the DUT 22. A more detailed discussion of choosing $f_r$ is provided hereinbelow.

The variable frequency stimulus signal, $S_v$, of each of the pairs has a variable carrier frequency, $f_v$. The variable carrier frequency $f_v$ is varied from one pair to the next in the time sequence in discrete frequency steps. Generally, the variable carrier frequency $f_v$ is varied in discrete frequency steps across the operational band or band of interest of the DUT 22 to create the time sequence of pairs of signals. The relationship between values of variable carrier frequency $f_v$ in adjacent steps is arbitrary, however, a monotonically increasing or decreasing relationship is often used in practice. Therefore, the sequence of signals produced by the stimulus waveform generator 20 comprises a sequence of pairs of signals $(S_r, S_v)$ each of duration $T_D$ wherein the variable carrier frequency $f_v$ of the variable frequency stimulus signal $S_v$ is normally stepped in discrete frequency steps across a predefined frequency range of interest.

The reference frequency stimulus signal, $S_r$, and the variable frequency stimulus signal, $S_v$, of each of the signal pairs are amplitude modulated by a low frequency sinusoid of frequency $f_m$ using a double sideband modulator. Ideally, the phase and amplitude of the amplitude modulation envelope of both modulated signals $S_r$ and $S_v$ are the same. In practice only reasonable care needs to be taken to insure that the difference between the amplitude and phase of the modulation envelopes of $S_r$ and $S_v$ are essentially constant. The spectrum of the reference frequency stimulus signal, $S_r$, of the stimulus waveform 21 that is produced by the preferred double sideband, suppressed carrier modulation with a sinusoid contains two principle spectral components. The component located below the reference carrier frequency $f_r$ is called the lower sideband (lsb) and is located a frequency $f_{r,lsb}=f_r-f_m$. The component above the reference carrier frequency $f_r$ is called the upper sideband (usb) and is located at a frequency $f_{r,usb}=f_r+f_m$. Similarly the variable frequency portion of the stimulus waveform has upper and lower spectral components at $f_{v,lsb}$ and $f_{v,usb}$ which are equally disposed about the variable carrier frequency, $f_v$, by $f_m$, the modulation sinusoidal frequency.

Accordingly, the modulated signal $S_r$ and the modulated signal $S_v$ can be described as a function of time by the equations $$S_r(t) = \frac{1}{2}\cos(2\pi f_m t)\cos(2\pi f_r t) \quad \text{(ii)}$$

$$S_v(t,k) = \frac{1}{2}C(f_v(k))\cos(2\pi f_m t)\cos(2\pi f_v(k)t) \quad \text{(iii)}$$

where $C(f_v(k))$ is an amplitude correction value corresponding to a given value of $f_v(k)$. The index κ is used herein to distinguish individual pairs of signals. The determination of the amplitude correction values, $C(f_v(k))$, are described in detail below. The output of the stimulus waveform generator 20 called the stimulus waveform 21 is given as a function of time by $$S(t)=S_r(t)+S_v(t,k) \quad \text{(iv)}$$

Figure 4:
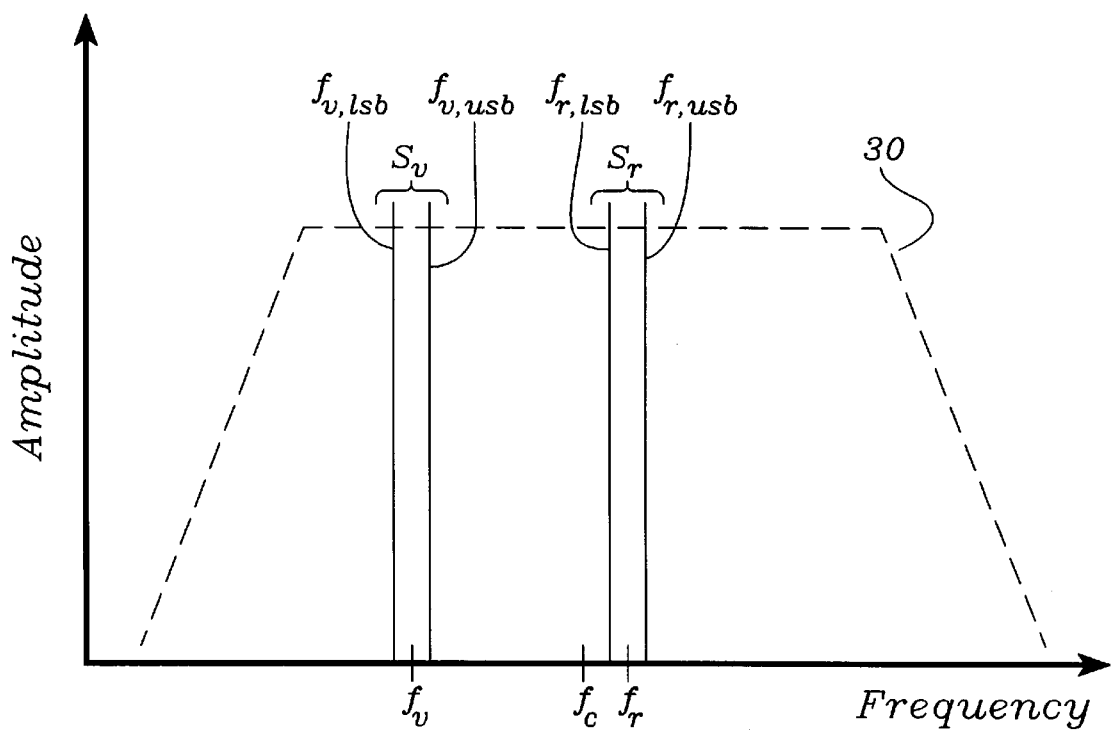
FIG. 4 illustrates a schematic representation of the spectrum of the stimulus waveform of the present invention superimposed on a spectrum of a typical device under test.

A schematic illustration of the amplitude spectrum of the output of the stimulus waveform generator 20 is provided in FIG. 4. A representative spectrum 30 for a typical DUT 22 is also shown in FIG. 4. FIG. 4 illustrates the spectrum of a $k^{th}$ pair modulated signals, $S_r$ and a given $S_v$. It should be readily apparent to one skilled in the art that other modulation waveforms and modulation types can be used instead of the double sideband, suppressed carrier modulation with a sinusoid. If other than a sinusoid is used to modulate the two carrier frequencies, the representative spectrums would be modified as predicted by modulation theory. Likewise, if an alternative modulation method were employed, the specific spectrum of to the two modulated carriers would also be modified. In general, the modulation has to have a relatively finite spectral extent or bandwidth in order to approximate $\Delta\phi/\Delta f$ to enable measurement of group delay at a "single" frequency. Spectral extent affects the effective signal-to-noise ratio of the measured results. Excessive spectral extent can render the results unusable.

Figure 5:
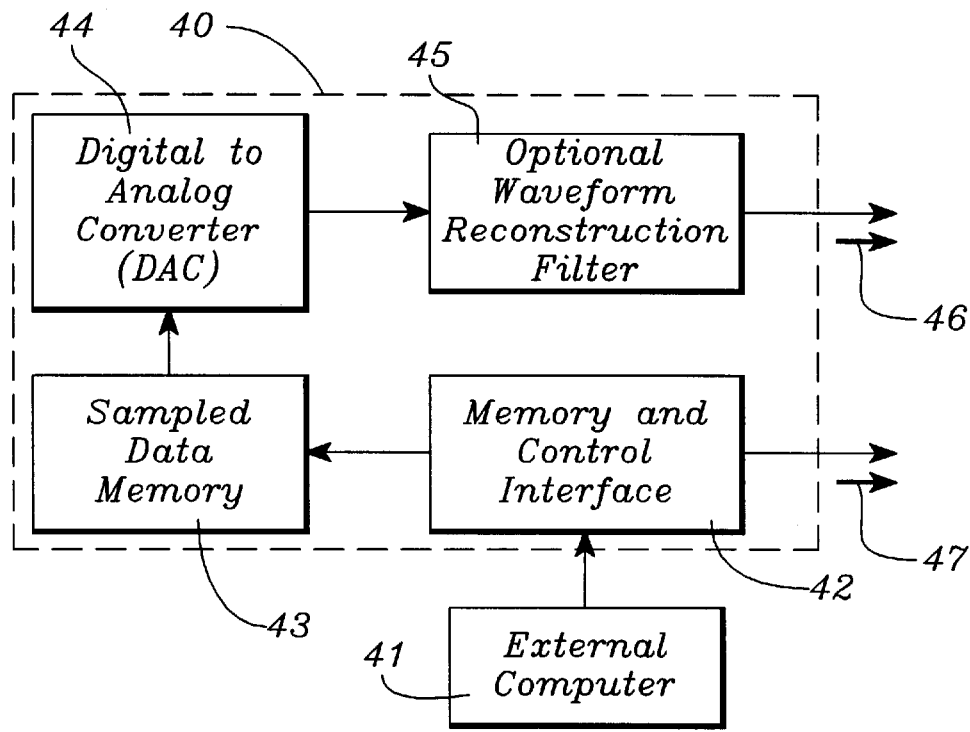
FIG. 5 illustrates a block diagram of an arbitrary waveform generator used as a stimulus waveform generator in accordance with the invention.

In the preferred embodiment of the system 200 of the present invention, the stimulus waveform generator 20 is implemented using an arbitrary waveform generator (AWG) 40, a schematic block diagram of which is illustrated in FIG. 5. Arbitrary waveform generators are commercially available, programmable function generators. Examples of such AWG's include model AWG-510 and AWG-520 sold by Tektronix, Inc. of Wilsonville, Oreg.; Model 2045 made by Analogic Corporation of Peabody, Mass.; models AWG500, AWG1000, and AWG1200 made by Chase Scientific Company of Aptos, Calif.; model 2416A made by Pragmatic Instruments of San Diego, Calif. The discussion herein regarding the AWG 40 is intended for illustrative purposes only. Other forms of the AWG 40 different from that illustrated in the block diagram of FIG. 5 would serve equally well as would be readily apparent to one skilled in the art.

The AWG 40 illustrated in FIG. 5 comprises a memory and control interface 42 for controlling AWG operation and interfacing with an external computer 41. The AWG 40 further comprises a sampled data memory 43, a digital to analog converter (DAC) 44 and an optional waveform reconstruction filter 45. As expressed further below, the preferred embodiment of the AWG 40 does not include the waveform reconstruction filter 45. The memory and control interface 42 interfaces with the external computer 41 to allow the programming of the AWG 40 to produce a desired output waveform 46. The values of each of a set of digital samples representing the desired output waveform 46 are computed in the external computer 41, encoded in a program suitable for execution by the AWG 40 and transferred to the memory and control interface 42 via an appropriate interface connection. The memory and control interface 42 implements the programming received from the external computer 41 and controls the generation of AWG 40 output waveforms 46. In part, the memory and control interface 42 stores a set of sampled data points that are in the sampled data memory 43. During operation of the AWG 40, the sampled data points are transferred from the sampled data memory 43 to the digital to analog converter (DAC) 44 at a rate determined by the memory and control interface 42. The rate of transfer is set by a DAC 44 sample clock with frequency $f_d$. The sample clock frequency $f_d$ of the DAC 44 is selected for alias-free generation of the waveforms at the desired output signal 21 frequencies of the stimulus waveform generator 20. Likewise the number of bits of resolution of the DAC 44 is chosen to minimize spurious signal generation or distortion.

The DAC 44 transforms each sampled data point into a corresponding analog value. A sequence of successive analog values output by the DAC 44 corresponding to the succession of sampled data points represents an output analog waveform. The output waveform 46 when applied to the DUT 22 becomes the analog stimulus waveform 21. The optional waveform reconstruction filter 45 can be inserted between the DUT 22 and the DAC 44 to filter the stimulus waveform 21. The action of this reconstruction filter 45 is to convert the sampled, discrete time output waveform produced by the DAC 44 to a continuous time waveform, through the natural bandwidth-limiting function of the filter. Waveform reconstruction filters 45 are commonly found in commercially available AWGs. In the preferred embodiment, the waveform reconstruction filter 45 is generally omitted and the natural bandwidth limiting characteristics of the DUT 22 are relied upon to perform the reconstruction function. The waveform reconstruction filter 45 is omitted in the preferred embodiment because, in some cases, this filter 45 can introduce unknown amplitude and phase variations in the output waveform 46. These unknown variations can and do degrade the accuracy of the measured results produced by the system 200 of the present invention.

Figure 6:
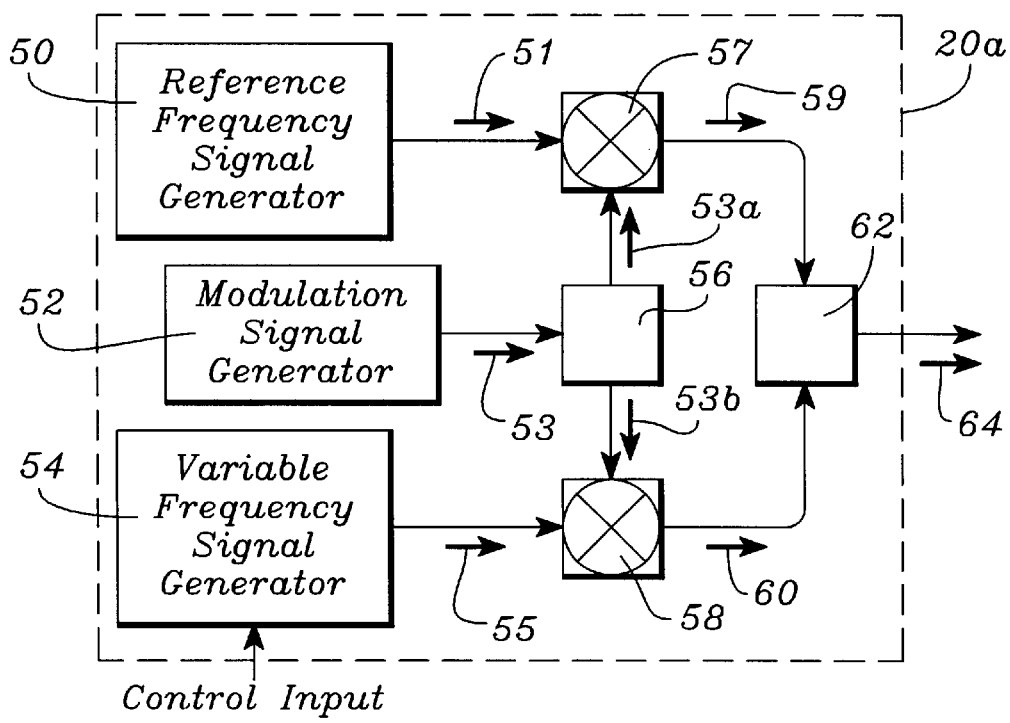
FIG. 6 illustrates a block diagram of another embodiment of the stimulus waveform generator in accordance with the invention.

In another embodiment, the stimulus waveform generator 20a is implemented using discrete analog components as illustrated in FIG. 6. The stimulus waveform generator 20a of this embodiment comprises a fixed or reference frequency signal generator 50 that generates a reference frequency output signal 51, a low frequency modulation signal generator 52 that produces a low frequency sine wave 53, and a variable frequency signal generator 54 that generates a variable frequency output signal 55. The stimulus waveform generator 20a further comprises a signal splitter 56 for splitting the low frequency sine wave signal into a first copy 53a and second copy 53b. The stimulus waveform generator 20a further comprises a first double sideband modulator 57 and a second double sideband modulator 58 each having a first input, a second input and an output wherein the first copy 53a of the sine wave signal 53 is applied to the first input of the first double sideband modulator 57 and the second copy 53b of the sine wave signal is applied to the first input of the second double sideband modulator 58. The reference frequency output signal 51 is applied to the second input of the first double sideband modulator 57, such that a modulated reference frequency signal 59 is produced at the output of the first double sideband modulator 57, the modulated reference frequency signal 59 being modulated by the low frequency sine wave signal 53. The variable frequency output signal 55, in turn, is applied to the second input of the second double sideband modulator 58 such that a modulated variable frequency signal 60 is produced at the output of the second double sideband modulator 58, the modulated variable frequency signal 60 also being modulated by the low frequency sine wave 53. The stimulus waveform generator 20a still further comprises a signal combiner 62 wherein the modulated reference frequency signal 59 and the modulated variable frequency signal 60 are combined by the signal combiner 62 to produce a stimulus waveform 64. The variable frequency signal source 54 includes a control input that allows its output frequency to be changed.

Generally the output frequency of the variable frequency signal source 54 is varied during the test in discrete frequency steps across the operational frequency band of the DUT 22 or the band of interest for the given test being performed. Although not necessary, the discrete frequency steps are typically chosen to be integer multiples of a sine wave modulation signal 53 frequency.

In still another embodiment, the stimulus waveform generator is implemented with partly digital and partly analog components. Examples of this embodiment of the stimulus waveform generator include generating the modulated reference frequency stimulus signal with a first digital-to-analog converter and generating the modulated variable frequency stimulus signal with a second digital-to-analog converter and then combining the resulting analog signals with an analog signal combiner. One of ordinary skill in the art can readily recognize other partially digital and partially analog configurations as well.

It is well known that a perfect stimulus waveform generator, one without unwanted amplitude and phase variations or imperfections in the output waveform produced, cannot be realized. This is true whether the stimulus waveform generator 20 is implemented with an AWG or an alternative means. These imperfections in the output waveform of the stimulus waveform generator 20 have a direct effect on the accuracy of the measurement results. The effect of these imperfections and consequently improved accuracy of the measurements produced by the present invention can be achieved by calibrating the stimulus waveform generator 20 prior to inserting the DUT 22.

Amplitude calibration of the stimulus waveform generator 20 used in the present system is accomplished by determining correction values, $C(f_v)$, which are nominally equal to one without calibration. The correction values are determined by initially setting all values of $C(f_v)$ to one. The stimulus waveform generator 20 is programmed by the external computer 41 or other means to produce a sequence of output sine wave signals described by equation (iii) at all discrete frequency steps $f_v$ that are of interest. An accurate laboratory spectrum analyzer or equivalent piece of test equipment is used to measure the non-ideal amplitude variation of the output waveform at each frequency step. A continuous function $\hat{C}(f)$ is fit to the data set produced thereby and a complimentary function $C(f)$ is computed. The complimentary function is one that corrects for the measured output variation at all frequencies $f_v$. The complimentary function is defined by $$\hat{C}(f)C(f)=1 \text{ for all } f=f_v \quad \text{(v)}$$

The value of the complimentary function $C(f)$ evaluated at the discrete frequency steps $f_v$ is used as the correction value in equation (iii) in subsequent use of the invention to measure a DUT 22.

Calibration of any group delay variation with frequency is generally not required when the generation means is an arbitrary waveform generator or other device of sufficiently wide frequency response. Potential group delay distortion may be caused by any component of the generator that is capable of storing energy selectively as a function of frequency. Generally, a DAC 44 without a reconstruction filter 45 or other analog component is not capable of significant group delay distortion versus frequency. Although the amplitude response of a DAC 44 may decrease as an output frequency approaches the Nyquist rate, this roll-off is not caused by a physical filtering mechanism, but rather by the natural (sin x)/x frequency response of a sampled data signal. However, this does not preclude the use of calibration to mitigate any group delay distortion encountered in practice and $C(f)$ can be viewed as a complex complimentary function in these cases.

Referring to FIG. 2, the ADC 24 samples or digitizes the output signal 23 of the DUT 22 produced by the application of the stimulus waveform 21. The characteristics of the ADC 24 that are relevant to the invention include a sample rate or sample frequency, A, bandwidth and the number of bits per sample. Except for sample rate, the ADC 24 performance characteristics should be chosen to be consistent with standard engineering practice in light of the characteristics of the DUT 22 and consistent with desired measurement precision.

The output of the system 200 of the present invention is the measurement of the signal transfer characteristics of the DUT 22. Once the output signal 23 of the DUT 22 has been sampled by the ADC 24 the sampled data is passed on to the signal processor 26 for processing. The signal processor 26 can be a specialized signal processing system or a general purpose computer programmed to carry out the signal processing task. The general purpose computer may be programmed in a variety of different ways and using a variety of different programming languages as would be obvious to one of ordinary skill in the art.

In accordance with the invention, the signal processor 26 transforms the data from the time-domain into the frequency domain. In the preferred embodiment, this transformation is accomplished by a discrete Fourier transform (DFT) implemented as a fast Fourier transform (FFT) of length N. The FFT length N establishes the number of independent frequency cells in the frequency domain. The frequency spacing between frequency cells is the frequency resolution of the FFT. As is well known to one skilled in the art, the frequency resolution of the FFT is given by $N/(2f_s)$. It is also known to one skilled in the art that the FFT transforms sampled time domain data into sampled frequency domain data.

The number of frequency cells, and thus the number of samples, N, primarily establishes the sensitivity of the measurement method. Noise in the output signal 23 of the DUT 22 can usually be expected to be spread more or less uniformly with respect to frequency. Therefore, the amount of noise power in any one frequency cell is proportionately reduced by the number of cells. On the other hand, all of the signal power of each of the four signals present in the output signal 23 resides entirely in one of four frequency cells. The increase of signal-to-noise ratio in one of these cells compared to the signal-to-noise ratio in all of the cells is proportional to the value of N, and is called the Processing Gain. Therefore, the selection of a specific value for N for a given DUT 22 and a desired measurement precision should be readily apparent to one skilled in the art without undue experimentation after consideration of the equations that predict error due to noise. The ability to resolve independent values of the measured transfer function versus frequency is established by a signal spacing of twice the modulation frequency, $f_m$, as described below.

Once a value of N has been selected and the FFT applied to the sampled data, the signal processor 26 further processes the data to yield the desired signal transfer characteristic measurement results. However, before describing the signal processing in more detail, the selection of the reference carrier frequency $f_r$, the sample rate $f_s$, the modulation frequency $f_m$ and the set of discrete variable carrier frequencies $f_v$ will be addressed.

The selection of the sample rate, $f_s$, is preferably determined by the desire for alias-free sampling of signals within an operational bandwidth at the output of the DUT 22. Alias-free sampling, in turn, is determined by conventional Nyquist sampling theory. Additionally, various sampling methods can affect the engineer's choice of sample rate $f_s$. Some examples of sampling methods include bandpass sampling, baseband sampling, and real or quadrature sampling. These sampling methods are generally dictated by a given system design. The processing techniques of the system 200 of the present invention apply equally to all such sampling methods, including designs that translate the input frequency band to a different frequency, and those that invert the output spectrum or not, as described by equation (i). Generally, but not necessarily, the sample rate is chosen such that the input frequency band appears translated in the FFT analysis spectrum so that the middle of the frequency band is near one fourth of the sample rate. Selection of this sample rate affords the maximum alias-free bandwidth for the ADC 24, as is well known according to standard sampling theory. Additionally, in some cases the sampling rate $f_s$ may be predetermined by the choice of the ADC 24 or other factors. The effect of the sampling rate $f_s$ and sampling type on the effective frequency translation as discussed above must also be considered. Of course, when considering the frequency translation described by equation (i), one skilled in the art would realize that this sampling related translation can be included in L without loss of generality.

The description below will be confined to real-time sampling although it applies to other sampling types as well. Given a real-sampling rate of $f_s$, the output of the stimulus waveform generator 20 is programmed so that after any frequency translations or spectral inversions are accounted for as described above, the reference frequency carrier $f_r$ appears at or near the middle of the FFT spectral analysis band (Nyquist band) at a frequency given by $$f_{r,out} = \left(\frac{N}{4} + G\right)\frac{f_s}{N} \qquad \text{(vi)}$$

where $f_{r,out}$ is related to the input reference carrier frequency $f_r$ by equation (i) with L including all translations and N is the size of the FFT that will be used in the signal processor 26 and is chosen as described hereinabove based on sensitivity and other requirements. Typically N is a power of two when an FFT is used. G is an integer number of frequency cells offset from the center of the band. The selection of G is intended to offset the value of $f_r$ such that the center of the reference frequency stimulus signal will not coincide with the center of any of the variable frequency stimulus signal frequencies $f_v$. An additional stipulation is that any of the sidebands of the variable signal should not coincide with the suppressed reference carrier frequency $f_r$. This is a preferable consideration especially if the reference carrier frequency component is not fully suppressed in the double sideband modulation. G may be positive or negative, and the preferred amount of frequency offset produced by the selection of G cells should be less than the modulation frequency $f_m$. The selection of the modulation frequency is described below. Therefore, a value of G can readily be determined by one skilled in the art without undue experimentation.

The variable carrier frequencies, $f_v$, comprise a set of discrete frequencies indexed on k and given by $$f_{v,out}(k) = \left(kS + \frac{S}{2}\right)\frac{f_s}{N} \qquad \text{(vii)}$$

where $$k = 0, 1, \ldots \left(\frac{N}{2S} - 1\right) \qquad \text{(viii)}$$

and where S is an integer number of frequency cells between frequency steps across the band of interest. As was the case for the fixed reference carrier frequency $f_r$, the values of $f_v$ are calculated from $f_{v,out}$ of equation (vii) using equation (i).

The number of cells, S, between frequency steps is selected based on the required number of steps across the Nyquist band. The number of cells per step is given by $$S = \frac{N}{2R} \qquad \text{(ix)}$$

where R is the number steps or records. R is also the number of points being measured in the transfer function and, therefore, the number of pairs of signals ($S_r$, $S_v$) being used as can be seen in equation (viii).

Selection of the number of steps or records R is further based on the following considerations that should be readily apparent to one of reasonable skill in the art. The system 200 of the present invention samples a continuous transfer function at the discrete frequency intervals of each step. The actual transfer function value of amplitude or group delay may vary rapidly or slowly with frequency, such that the variations may or may not be faithfully represented by the samples. The purpose of making the measurement largely determines the required fidelity. For example if the DUT 22 is characterized by weak, long duration internal signal echoes such as triple transit reflections in a surface acoustic wave device, the transfer function will exhibit rapid phase variation with frequency. A time echo of 0.5 microseconds in this case would produce sinusoidal phase variations with a period of 2 MHz. If the purpose of the measurement performed by the system 200 of the present invention is to disclose these variations, then the transfer function must be measured at intervals smaller than 1 MHz, according to the sampling theory applicable to frequency domain functions. Therefore, a bandwidth of 100 MHz would require 100 steps. According to conventional sampling theory, complete characterization of the transfer function requires measurements at N/2 points in frequency for N real time samples of the stimulus waveforms. However, this is rarely required in practice and somewhat coarser sampling generally will usually suffice. Furthermore, the system 200 of the invention employs an approximation of group delay over a finite interval of frequency instead of a derivative at a single frequency. This interval is the spacing between modulation sidebands of the variable and fixed signals. This limits the resolution of the transfer function measurement to a value approximating twice the frequency of the modulation frequency. For example, a modulation frequency $f_m$ of 200 kHz can be expected to resolve a maximum of 250 points across a bandwidth of 100 MHz. Therefore, the preferred maximum frequency step size is $2f_m$.

On the other hand, lumped constant analog filters exhibit slow variation of phase or group delay versus frequency. Accordingly, fewer samples of the transfer function may adequately serve the purpose of characterizing those variations, depending on the application of such measurements.

Accordingly, the variable carrier frequency $f_v$ varies incrementally in steps of $Sf_s/N$ Hz. The preferred first frequency $f_v(0)$ is one half step above zero Hz and the last frequency $f_v(N/2S-1)$ is one half step below the Nyquist rate or one half the sample rate. The number of steps across the band is determined by the desired resolution with which the transfer function is to be measured in the frequency domain. Furthermore, the variable carrier frequency, $f_v$, should never equal the reference carrier frequency $f_r$. This is insured by proper choice of the value of G as indicated hereinabove. It is anticipated that other selections of the variable carrier frequency $f_v$ would likely work as well as those given by equation (vii) provided that these variable carrier frequencies $f_v$ have approximately the same frequency range coverage and step size as that of variable carrier frequencies $f_v$ of equation (vii).

The modulation frequency $f_m$ is chosen such that it is an integer multiple of the frequency cell spacing of the FFT used in the signal processor 26. Accordingly the value of $f_m$ is given by $$f_m = \frac{Mf_s}{2N} \qquad \text{(x)}$$

where M is an integer greater than 2 and approximately less than or equal to 9. The effect of choosing $f_m$ as given by equation (x) in light of the value of $f_r$ given above is that the upon application of the FFT in the signal processor 26 to the sampled data produced by the ADC 24 the reference signal sidebands will have a minimum separation of 3 cells. Thus, the preferred value of M is selected to adjust the precision with which the phase and group delay will be computed given available signal-to-noise ratio (SNR) per frequency cell as described hereinbelow. A larger modulation frequency means that group delay is approximated over a larger frequency interval, $2f_m$, instead of being measured ideally at a single value of frequency. The effect is that of "smearing" any rapid change in group delay over frequency.

As described above, the stimulus waveform generator 20 produces a time sequence of pairs of modulated signals ($S_f$, $S_v$) also called modulated signal bursts. Each pair of signals is produced by the stimulus waveform generator 20 for a period of time $T_D$ known as a "burst duration". In general, $T_D$ must be of sufficient length to enable at least N samples to be taken of the DUT 22 output signal 23 by the ADC 24. Therefore, according to the invention the burst duration of each pair of modulated signals ($S_f$, $S_v$) can be determined by the equation $$T_D = \frac{D}{f_d} > \frac{N}{f_s} \quad (xi)$$

where D is the number of data samples used by the DAC 44. Preferably, the burst duration should be 10% greater than the minimum indicated by equation (xi). Consequently, a sufficient value of D is given by $$D = 1.1 \frac{N f_d}{f_s} \quad (xii)$$

The amplitudes of waveforms described by equations (ii)–(iv) are normalized to a value of one to simplify the discussion. In practice, the peak values of the waveform samples should be close to, but not exceed, the full scale value of the DAC 44 to produce the maximum ratio of signal output power to quantization noise power. Since each waveform is the sum of four sinusoids of various phases and frequencies, the peak value of S(t) will vary. Furthermore, the correction factor $C(f_v)$ in equation (iii) introduces additional amplitude variation in the set of stimulus waveforms. In the preferred embodiment, a constant scale factor SF is applied to all signal pairs ($S_f$, $S_v$) in S(t). This approach does not vary the waveform power according to the ratio of the peak to RMS power. An alternative approach is to apply individual scale factors to each pair of signals in order to maximize output SNR. After computing samples for all waveforms, the maximum peak to peak value, VPP, is determined. All samples are then multiplied by the scale factor SF determined by the equation $$SF = \frac{DFS}{2VPP} \quad (xiii)$$

where DFS is a digital to analog converter peak to peak full scale value (i.e. 1024 for 10-bit DAC) and VPP is a maximum peak to waveforms.

The stimulus waveform generator 20 preferably issues successive waveform bursts separated by a minimum time gap. The time gap duration meets the requirement of the digitizer/memory capture device for recognizing a trigger event, acquiring the waveform, and re-arming its trigger mechanism for the next waveform event. In many automatic test systems, it is desirable to minimize the time that the DUT 22 is subjected to a test signal, and therefore, the duration of each burst and the time gap between them. The stimulus waveform generator 20 can trigger the capture of the digitized data by the ADC 24 at the output of the DUT 22 by several methods. Some AWGs 40 that can be used to implement the stimulus waveform generator 20 provide an optional waveform acquisition trigger signal as depicted in FIG. 5 that is separate from the waveform output. The trigger signal 47 generally takes the form of a pulse that precedes the generation of the waveform. This acquisition trigger signal 47 may be used to trigger the acquisition of the waveform by a digitizer. Most ADCs 24 are designed to acquire blocks of data either upon occurrence of an externally applied trigger event, or upon detection of an input signal that exceeds a pre-programmed threshold voltage level. The latter type of trigger event is referred to as an internal trigger. In some applications of the system 200 of the present invention, the digitizer or ADC 24 does not have access to a real-time external trigger. Applications include remote operation of the generator, or waveform playback by a tape recorder. In similar cases, a reliable internal trigger timing event is required so that at least N samples of the digitized waveform can be captured automatically. The envelope of the stimulus waveform often does not provide a reliable trigger event because its rise time is slow. Therefore, the time at which it crosses a trigger threshold is too variable to guarantee capture of N samples following the event, unless an excessively large number of samples or alternatively an excessively long waveform burst was generated. It is desirable to minimize the waveform burst duration.

Figure 7:
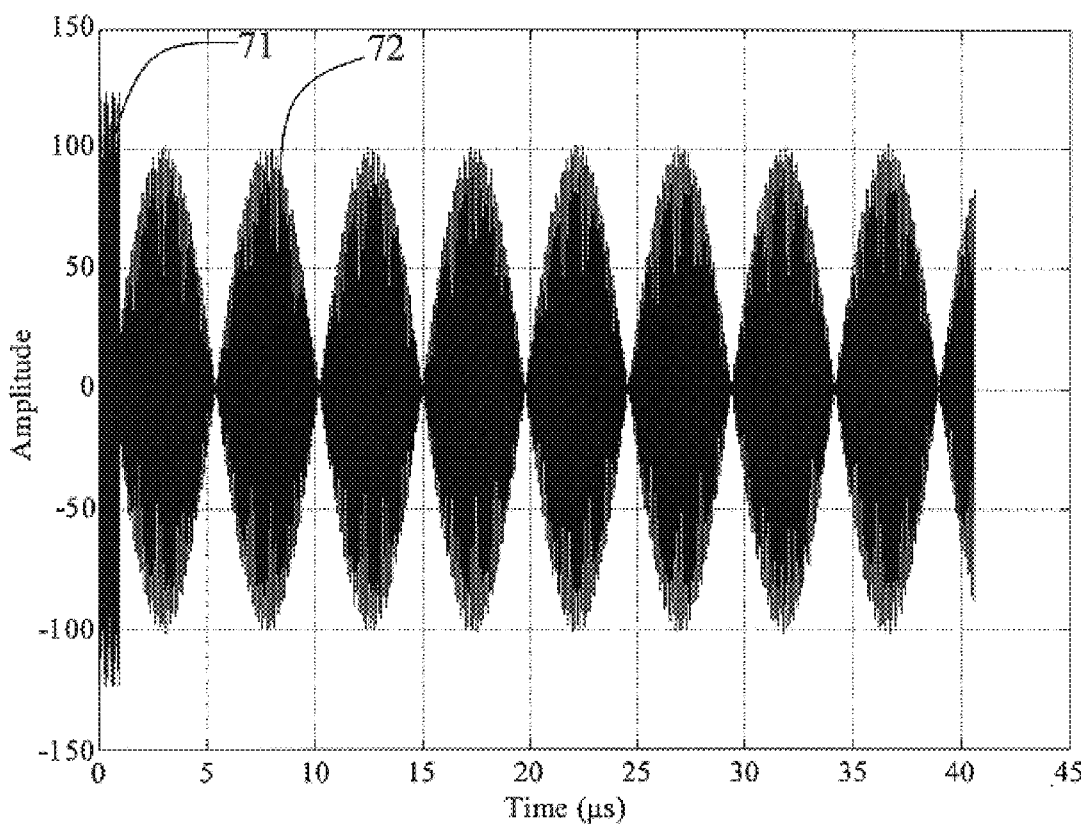
FIG. 7 illustrates a time domain plot of a typical stimulus waveform signal pair including a sync pulse produced by the stimulus waveform generator of FIG. 5 or FIG. 6.

According to the system 200 of the present invention a means is provided whereby a narrow synchronization (SYNC) pulse 71 can be made to precede the beginning of each waveform burst for the sole purpose of facilitating the capture of ADC 24 data blocks into memory. The SYNC pulse 71 consists of a short duration sine wave burst or pulse at a carrier frequency near mid-band as shown in FIG. 7. FIG. 7 also illustrates a typical stimulus waveform 72 comprised of a particular pair of signals ($S_v$, $S_f$) which are shown following the SYNC pulse. The duration of the SYNC pulse 71 is typically on the order of two percent of the waveform duration, which is ten percent larger than the minimum duration of the N samples required for processing. The amplitude of the pulse is programmed for full scale value of the DAC 44. The rise time of the SYNC pulse 71 is sufficiently fast that a reliable internal trigger is thereby achieved for virtually any threshold value. Waveform acquisition by the ADC 24 is typically programmed to begin sufficiently after the trailing edge of the SYNC pulse 71 to avoid any interference with the stimulus waveform 21 due to echoes, for example.

After all of the stimulus waveform 21 signal pairs have been applied to the DUT 22 and the output 23 produced by the DUT 22 has been digitized, the data 25 produced is collected by the signal processor 26. Each waveform burst consists of a number of samples approximating 1.1N according to equation (xii). The signal processor 26 then applies a series of digital signal processing operations to generate the desired measurement results. The details of some of the applicable signal processing follows.

As noted above, the system 200 of the present invention can produce, among other things, a transfer function for the DUT 22. The generalized form of the transfer function to be computed as described below is given by $$H(\omega_v) = A_v e^{j\phi_v}, \quad v = 1, 2, \ldots R \quad (xiv)$$

where to $\omega_v = 2\pi f_v$ are the discrete angular frequencies at which the transfer function is measured, $A_v$ is the complex magnitude and $\phi_v$ is the phase angle of the $v^{th}$ discrete frequency.

In the preferred embodiment, the signal processor 26 calculates the normalized transfer function (NTF) of the DUT 22 as described below. A normalized transfer function (NTF) is defined as one in which the magnitude versus frequency data is divided by the maximum magnitude. The group delay versus frequency is normalized by subtracting the group delay value at a frequency near the center of the band from the group delay at all frequencies. The NTF can be computed from the captured digitized data records in the following manner, assuming real sampled time data with no loss of generality.

Processing begins by computing an FFT of each record of N time samples. The complex FFT values are saved at frequencies corresponding to the four sine wave signals in each record (i.e. the upper and lower sidebands of $S_r$ and $S_v$).

At each variable frequency, $f_v$, the magnitude, $M_v$, as the average magnitude of both sidebands of the variable signals is computed. The computed magnitude $M_v$ is normalized by the average magnitude of the reference frequency $f_r$ upper and lower sideband signals in the $v^{th}$ record, $M_r$. The resulting transfer function magnitude versus fequency is then given by:

$$A_v = \frac{M_v}{M_r} \quad \text{(xv)}$$

According to the present invention, the normalized group delay can be calculated directly from the collected data and the phase is computed as the cumulative sum of group delay versus frequency.

Figure 8:
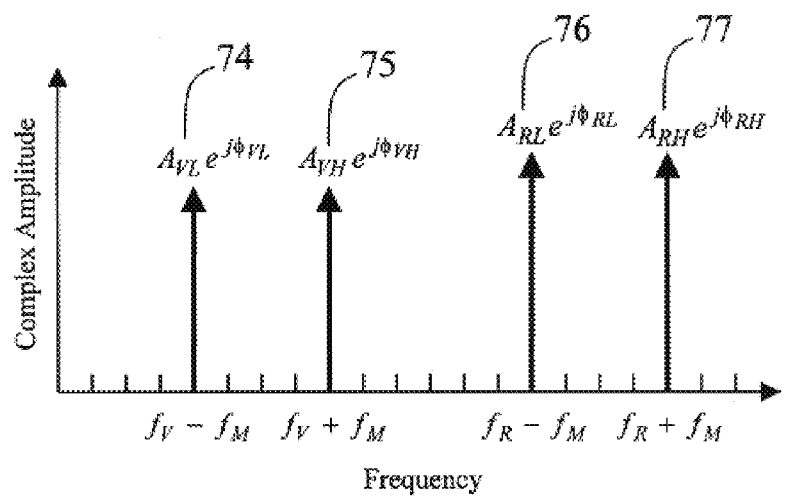
FIG. 8 illustrates diagrammatically the principle spectral content of the FFT of the output signal from the analog-to-digital converter in accordance with the embodiment of the invention in FIG. 2.

The N samples in each record are processed using the Fast Fourier Transform (FFT). The magnitude and phase at the four pre-determined frequencies corresponding to the upper and lower sidebands of the reference frequency $f_r$ and variable carrier frequencies $f_v$ are illustrated in FIG. 8. These complex values show as 74, 75, 76, 77 in FIG. 8 are utilized to compute amplitude and group delay versus frequency.

Group delay, $\tau$, is normally defined as the negative differential of phase with respect to angular frequency. Group delay is a positive value in units of seconds.

$$\tau \equiv -\frac{d\phi}{d\omega} \quad \text{(xvi)}$$

where $\omega = 2\pi f$.

According to the system 200 of the present invention and as is conventional, the derivatives of equation (xvi) are approximated with the finite increments of the phase and frequency as shown in the equation $$\hat{\tau} = -\frac{\Delta\phi}{\Delta\omega} \quad \text{(xvii)}$$

An estimate of normalized group delay as a function of variable frequencies with respect to the reference frequency can be computed as given by $$\hat{\tau}_N(\omega_v) = \quad \text{(xviii)}$$

$$\hat{\tau}_R - \hat{\tau}_V = \frac{\phi_{VH} - \phi_{VL}}{2\omega_m} - \frac{\phi_{RH} - \phi_{RL}}{2\omega_m} = \frac{\phi_{VH} - \phi_{VL} - \phi_{RH} + \phi_{RL}}{2\omega_m}$$

where $\omega_V = 2\pi f_v$ is the angular frequency of the variable carrier, $\hat{\tau}_R$ is the estimated group delay of the reference signal modulation, $\hat{\tau}_V$ is the estimated group delay of the variable signal modulation, $\phi_{VH}$ is the phase of the upper sideband of the variable modulated signal, $S_v$, $\phi_{VL}$ is the phase of the lower sideband of the variable modulated signal, $S_v$, $\phi_{RH}$ is the phase of the upper sideband of the reference modulated signal, $S_r$, $\phi_{RL}$ is the phase of the lower sideband of the reference modulated signal, $S_r$, and $\omega_m = 2\pi f_m$ is angular modulation frequency Normalized group delay may take on negative values of time since it is referred to as the value of delay at the reference frequency. In computing the normalized group delay according to equation (xviii), the phase in the numerator of the last term can vary modulo $2\pi$ as the variable carrier frequency $f_v$ steps across the band. As a consequence, successive values of the phase must be unwrapped in order to obtain a more or less unconstrained, continuous function of the phase. Phase unwrapping is a process that is well-known in the art.

However, in accordance with the system 200 of the present invention, normalized group delay can be computed without the need for phase unwrapping cited above. This is accomplished by computing a phase value that is proportional to the delay directly from the complex FFT values of the modulation spectral components.. This approach obtains the phases of the low frequency modulation at the reference and variable carrier frequencies, $f_r$ and $f_v$. Since the modulation tone $f_m$ is relatively low in frequency with respect to the bandwidth of the DUT 22, the change in group delay across the band will generally be less than the period of the modulation. Therefore, the phase of the tone is generally unambiguous. Even if it is not for a particular case, phase unwrapping can be applied to unambiguously resolve phase versus frequency. Let FY be the FFT of the N time samples. The normalized group delay at one of the variable frequencies is then given by the equation $$\hat{\tau}_N(\omega_V) = \hat{\tau}_V - \hat{\tau}_R = \frac{1}{2\omega_M}(angle(FY(\omega_{VH})) \cdot conj(FY(\omega_{VL})) - \quad \text{(xix)}$$

$$angle(FY(\omega_{RH})) \cdot conj(FY(\omega_{RL})))$$

where $conj(\cdot)$ means complex conjugate of an argument and $angle(\cdot)$ means the phase angle of the complex argument. In equation (xix), $\omega_{RH} = 2\pi f_{RH}$ is the angular frequency of upper sideband of the reference $f_r$ and $\phi_{RL} = 2\pi f_{RL}$ is the angular frequency of the lower sideband of the reference frequency $f_r$. Also in equation (xix), $\phi_{VH} = 2\pi f_{VH}$ is the angular frequency of upper sideband of the variable frequency $f_v$ and $\phi_{VL} = 2\pi f_{VL}$ is the angular frequency of the lower sideband of the variable frequency $f_v$.

The phase of the normalized transfer function is computed as the cumulative sum of the group delay samples. The deviation from linear phase is often of interest in evaluating the transfer function. The deviation can be computed by removing the linear slope over a specified portion of the frequency range, starting at 'a' and ending at 'b'. This is computed equivalently by subtracting the mean group delay over the region from a to b from the normalized group delay prior to computing the cumulative sum, according to equation $$\Phi(\omega_X) = 2\omega_M \sum_{Z=1}^{X} (\hat{\tau}_N(\omega_Z) - \bar{\tau}|_a^b) \quad \text{(xx)}$$

where $\hat{\tau}_N$ is the normalized group delay at the measured frequencies, and $\bar{\tau}|_a^b$ is the mean group delay over the frequency interval from a to b. Then, substituting for mean group delay, the following is obtained $$\Phi(\omega_X) = 2\omega_M \sum_{Z=1}^{X} \left[\hat{\tau}_N(\omega_Z) - \frac{1}{b-a+1} \sum_{K=a}^{b} \hat{\tau}_N(\omega_K)\right], \quad \text{(xxi)}$$

$$X = 1, 2, 3, \ldots R$$

where, as before, R is the number of points measured in the frequency domain.

Unlike many conventional approaches to measuring signal transfer characteristics, the present invention provides highly accurate and precise results. In addition, the accuracy of the measurements can be predicted. The following discussion details the prediction of accuracy according to the present invention. It is provided to demonstrate the predictability of the measurement accuracy afforded by the present invention.

Accuracy is quantified by the standard deviation of the values of magnitude, phase, and group delay. The stimulus waveform consists of four sine wave signals (i.e. upper and lower sidebands of $S_r$ and $S_y$) of nominally equal magnitude and differing frequencies in the passband portion of the response. The voltage ratio of peak-to-RMS value of the waveform is $2\sqrt{2} \approx 2.82$. The corresponding peak-to-RMS power ratio, hereinafter referred to as "crest factor", is 8.0 (approximately 9 dB). The output 23 of the DUT 22 is typically limited in linear dynamic range. Dynamic range is customarily defined by a maximum output sine wave signal-to-noise power ratio (SNR). A single sine wave has a crest factor of two (3 dB). In many practical cases of interest, the quantization noise of the ADC 24 limits the available SNR relative to full scale power output. The crest factor of a four-tone stimulus waveform is noted to be 4 times (6 dB more than) that of a sine wave. Therefore, if a DUT 22 is capable of a dynamic range (DR), then maximum output SNR of a calibration waveform of four sine waves is DR/4. Any one sine wave signal constitutes one fourth of the output power. The maximum SNR of a sine wave is therefore (1/4)(DR/4)=DR/16, or 12 dB less than the dynamic range of the DUT 22. Assuming noise is spread evenly across the Nyquist bandwidth, the noise in one of N/2 independent frequency cells of the FFT output is $2/N^{th}$ of the total noise. Accordingly, the maximum sine wave power to noise ratio, $SNR_{CELL}$, in a frequency cell is N·DR/32 as shown in the equation $$SNR_{CELL} = \frac{N \cdot DR}{32} \quad \text{(xxii)}$$

For large SNR, the RMS error (radians) in determining phase of a sine wave in Gaussian noise is well known in the art, and is given by the equation $$\delta\phi = \frac{1}{\sqrt{SNR_{CELL}}} \quad \text{(xxiii)}$$

Additionally, the transfer function phase is derived from addition or subtraction of four independent phase random variables with the same RMS error. Therefore the standard deviation of the measured phase is given as in the equation $$\sigma_\phi = \delta\phi\sqrt{4} = \frac{2}{\sqrt{SNR_{CELL}}} \quad \text{(xxiv)}$$

Similarly, the fractional RMS error in measuring the amplitude, A, of one sine wave can be determined by the equation $$\frac{\delta A}{A} = \frac{1}{\sqrt{SNR_{CELL}}} \quad \text{(xxv)}$$

Likewise, the magnitude of the transfer function is obtained from two independent masurements of averaged pairs of amplitudes. Averaging reduces the error of each pair-wise measurement by the square root of two. The standard deviation of the magnitude is then given by $$\sigma_M = \sqrt{\left(\frac{\sigma_A}{\sqrt{2}}\right)^2 + \left(\frac{\sigma_A}{\sqrt{2}}\right)^2} = \sigma_A = \frac{1}{\sqrt{SNR_{CELL}}} \quad \text{(xxvi)}$$

A significant advantage of the invention over prior art is the ease with which the measured errors can be reduced by simply extending the duration of the calibration signals. This is especially applicable to a DUT 22 that has a limited output SNR.

For example, assume that the DUT 22 has a maximum output SNR of DR=10,000 (40 dB), and that N=8192 samples are captured per calibration waveform. The SNR in a frequency cell is approximately 64 dB. The transfer function RMS phase error is estimated using equation (xxiii) at $$\sigma_\phi = \frac{2}{\sqrt{SNR_{CELL}}} = \frac{2}{\sqrt{\frac{N \cdot DR}{32}}} = \frac{8\sqrt{2}}{\sqrt{N \cdot DR}} \quad \text{(xxvii)}$$

$$= 1.25 \times 10^{-3} \text{ radians} \approx .072 \text{ deg RMS}$$

The standard deviation of the group delay measurements is the phase error divided by the tone spacing.

$$\sigma_\tau = \frac{\sigma_\phi}{2\omega_m} \quad \text{(xxviii)}$$

Assuming a sample rate $f_s$ of 200 MHz, and a modulation frequency $f_m$ of 200 kHz, the standard deviation of group delay measurement due to noise is 0.5 nanoseconds as seen by $$\sigma_\tau = \frac{\sigma_\phi}{4\pi f_m} \approx \frac{1.25 \times 10^{-3}}{2.51 \times 10^6} = 0.5 \times 10^{-9} \text{ sec}$$

The standard deviation of the magnitude error is quite small, and is found from the application of equation (xxvi) to be $$\sigma_M = \frac{1}{\sqrt{SNR_{CELL}}} = 6.25 \times 10^{-4}$$

This equates to $10 \log_{10}(1+6.25e-4)$, or 0.003 dB.

Figure 9A:
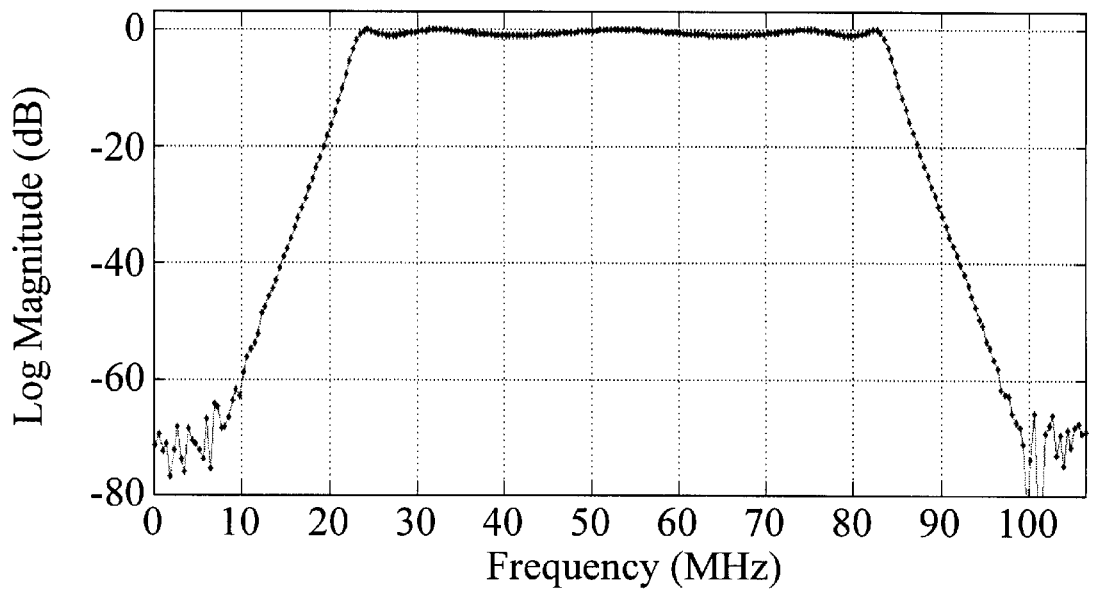
FIGS. 9a and 9b illustrate plots of the amplitude and group delay response of a Chebyshev filter as measured by the present invention.
Figure 9B:
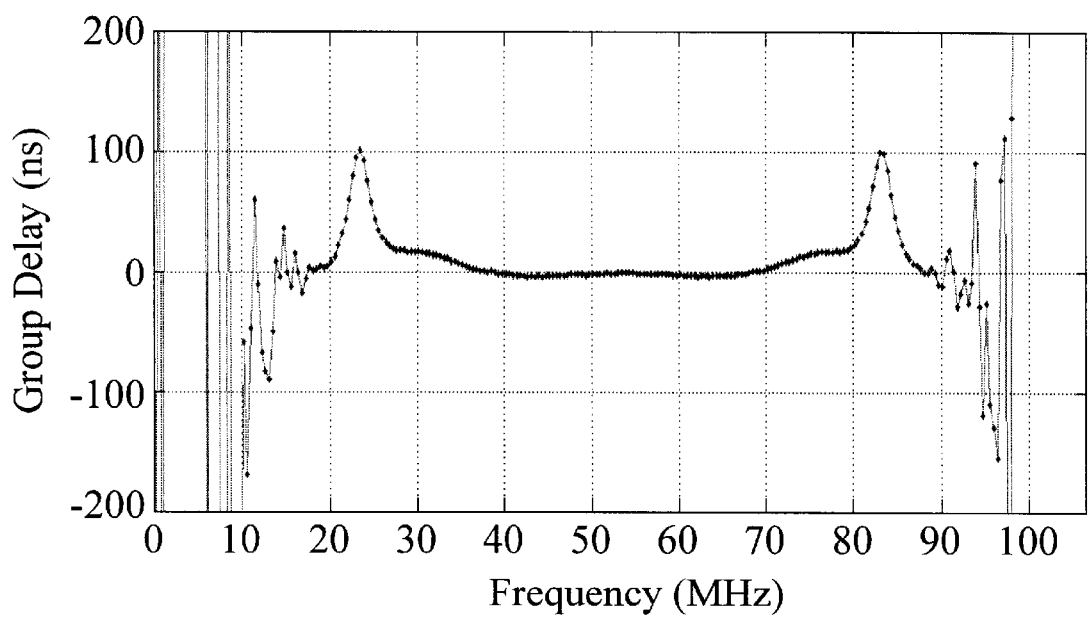
Figure 10:
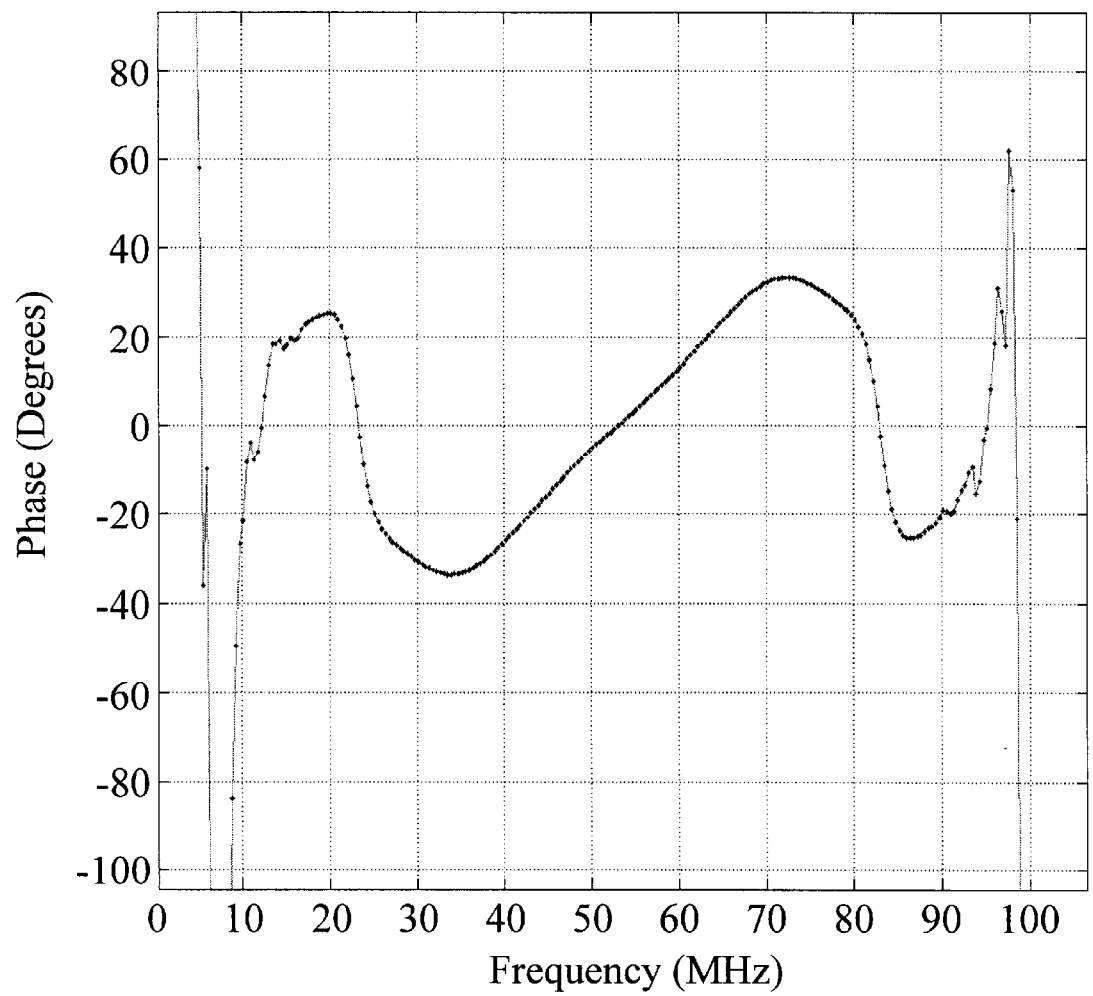
FIG. 10 illustrates an a plot of phase vs. frequency for a measured DUT showing deviation from a linear phase response.

An illustrative example of a measured DUT 22 consisting of a Chebyshev bandpass filter is shown in FIG. 9a. The maximum SNR out of the DUT 22 in this example is 40 dB (DR=10,000). The input frequency band of the DUT 22 is centered at 160 MHz, and sampled at a sample rate of $f_s$=213.333 MHz. A plot of the group delay versus frequency is shown in FIG. 9b. FIG. 10 shows deviation from linear phase.

The system 200 of the present invention also advantageously measures non-linear distortion effects in a DUT 22. These include harmonics, sub-harmonics, and spectral images resulting from frequency translations or imperfect complex (I–Q) sampling operations, wherein such spectral components fall into predictable frequency cells after FFT analysis of the time samples.

Figure 11A:
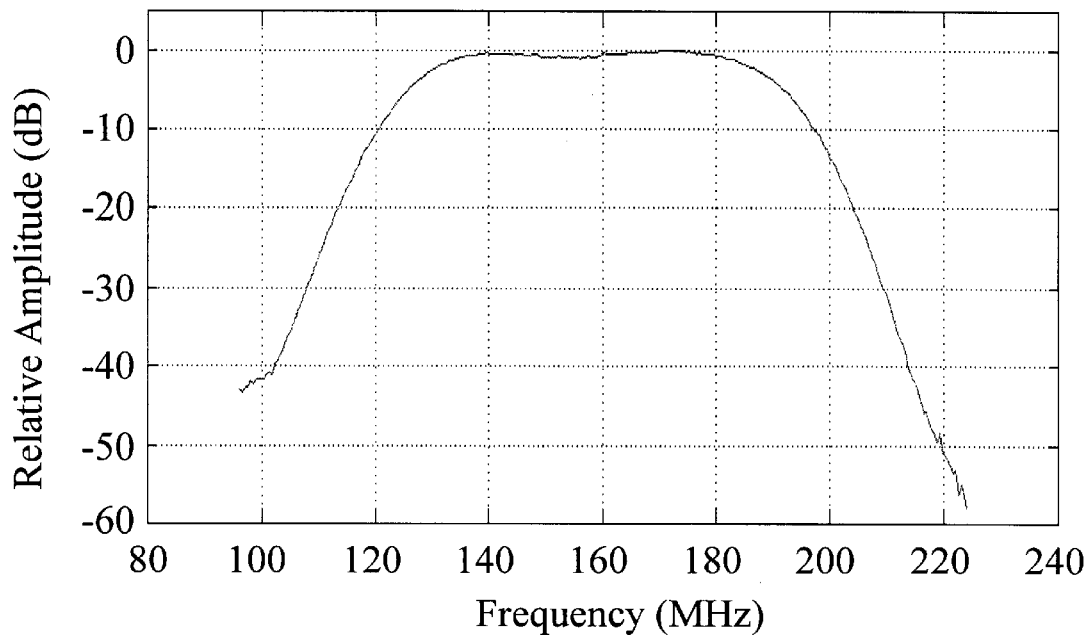
FIGS. 11a and 11b illustrate plots of measured amplitude and image rejection data from a DUT that includes an analog-to-digital converter in accordance with the present system FIG 3.
Figure 11B:
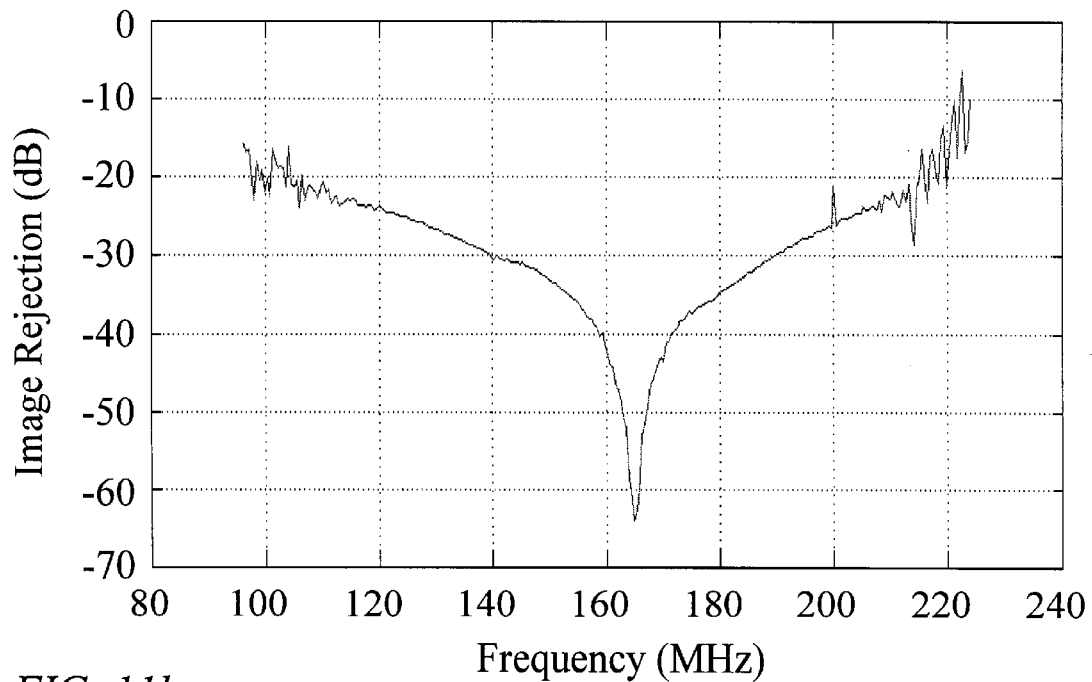

FIG. 11 is an illustrative example of using of the system 200 of the present invention to measure the image rejection of a DUT 22a as a function of frequency. The DUT 22a in this example is a digitizer which employs complex sampling of a band of signals centered at an input frequency of 160 MHz that are subsequently converted to zero frequency before sampling. The quadrature imbalance in magnitude and phase of the DUT 22a gives rise to image frequencies symmetrically disposed about the band center of 160 MHz. Additionally, the DUT 22a of this example employs an imperfect method of imbalance compensation. The plot illustrated in FIG. 11a shows the bandpass amplitude response of DUT 22a at the fundamental, with a corresponding image response shown FIG. 11b. The system 200 of the present invention is capable of measuring the complex magnitude and phase of the images relative to a point near mid-band. Applied to such device, this information can be used, for instance, to compute the coefficients of a finite impulse response (FIR) filter that could be used to introduce magnitude and phase corrections to the real and imaginary samples across the entire band thereby correcting for the measured imbalance at all frequencies of operational interest. The general method for computing the coefficients of such an FIR filter for equalization are well known in the art.

Figure 12:
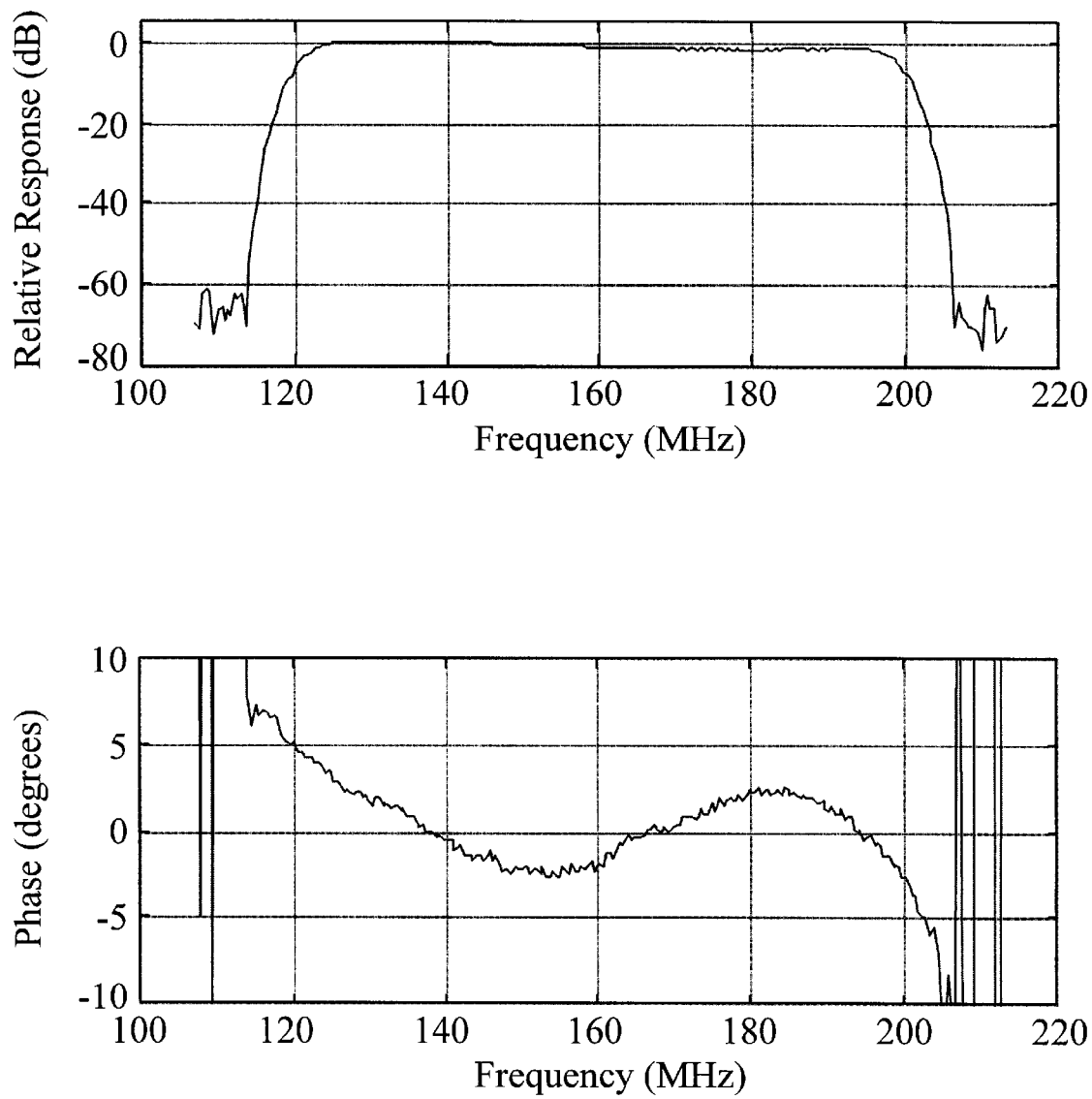
FIG. 12 illustrates plots of the measured normalized transfer function as produced by the present invention from an intermediate frequency (IF) processor/digitizer before equalization.
Figure 13:
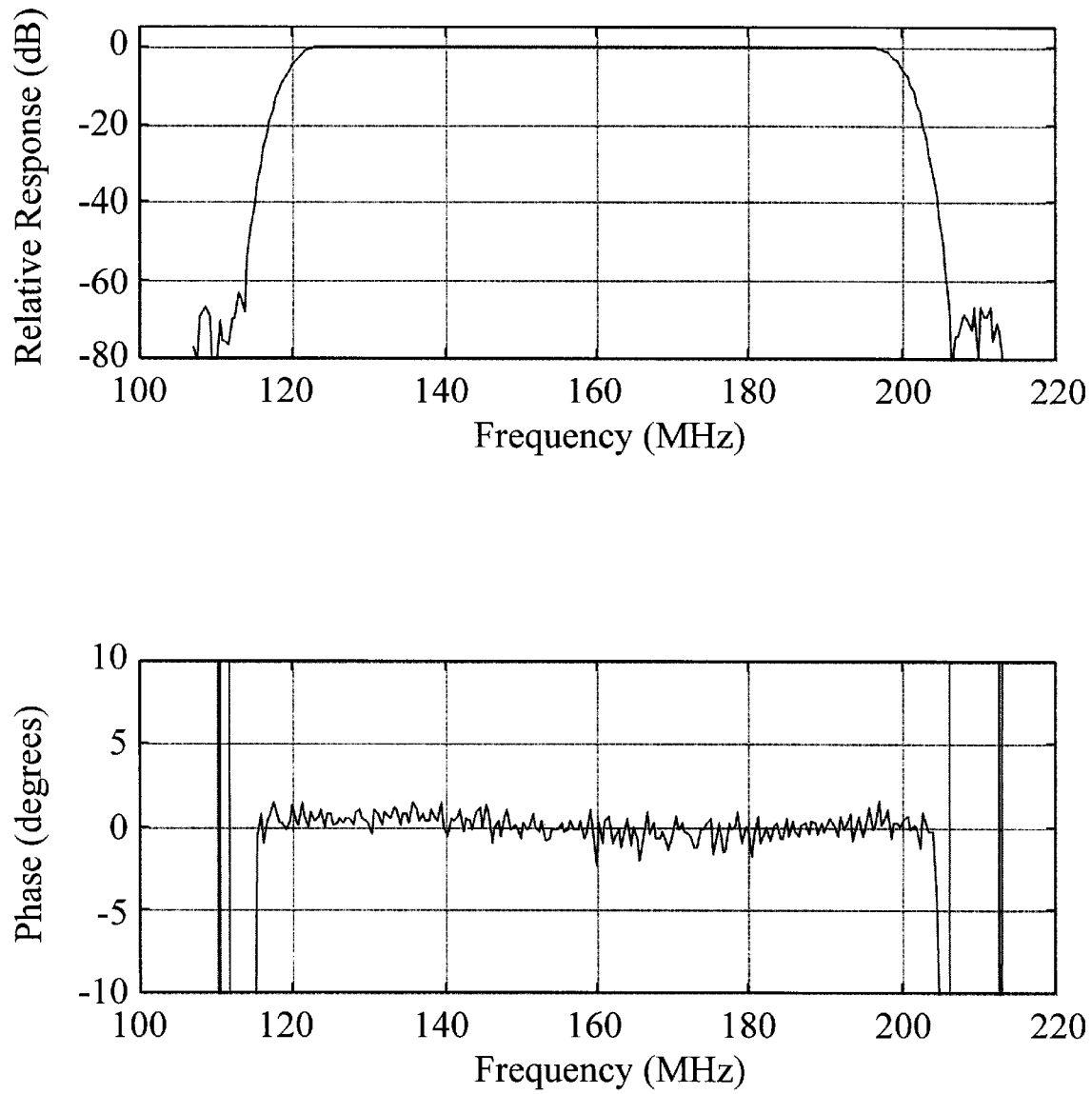
FIG. 13 illustrates the measured normalized transfer function as produced by the present invention from the same IF processor/digitizer of FIG. 12 after the application of an equalizer designed using data produced by the application of the present invention.

An example of a measured transfer function before equalization is shown in FIG. 12. The frequency scale shown is referred to the input of the DUT 22, whereas the actual frequency cells of the FFT were within the Nyquist band from zero to 106.66 MHz. The amplitude response is observed to be sloped several dB at the high end of the bandpass, and the phase deviation was 10 degrees peak-to-peak over a region of interest. FIG. 13 shows the response after FIR equalization to a "flat" response. The magnitude versus frequency is now virtually flat, and phase deviation from linearity is on the order of tenths of a degree over a 90 MHz band. Amplitude variations over the passband of the order of 0.1 dB peak to peak are evident after equalization. The computed FIR coefficients used for the equalizer in this example as well as the plotted data, both before equalization and after, were obtained by applying measurement methods of the system 200 of the present invention.

Figure 14:
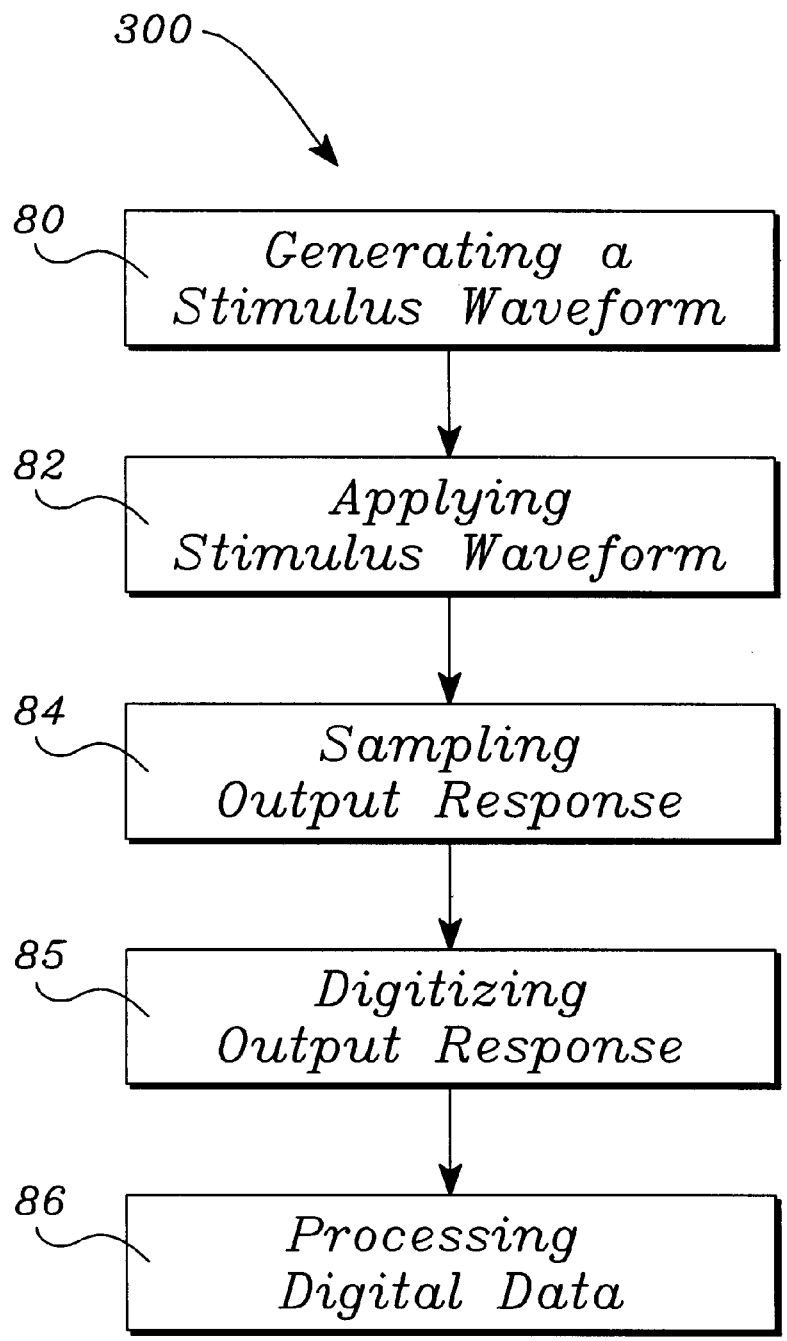
FIG. 14 illustrate a flow chart of the method of the present invention.

The present invention also provides a method 300 is illustrated in FIG. 14 for measuring the signal transfer characteristics of a device under test DUT 22 having an input port and an output port comprising the step of generating 80 a stimulus waveform wherein the stimulus waveform comprises a time sequence of pairs of narrowband modulated signals, and wherein each of said pairs comprises a reference frequency modulated signal, and a variable frequency modulated signal. The reference frequency modulated signal is a double sideband, suppressed carrier, modulated signal having a reference carrier frequency, wherein the fixed reference frequency modulated signal is modulated by a low frequency modulation signal. The variable frequency modulated signal is a double sideband, suppressed carrier, modulated signal having a variable carrier frequency wherein the variable frequency modulated signal is modulated by the low frequency modulation signal, and wherein said variable carrier frequency is variable from pair to pair in the sequence of pairs.

The method of measuring further comprises the step of applying 82 the stimulus waveform to the input port of the DUT such that an output response signal is generated at the output port of the DUT. The method still further comprises the steps of sampling 84 and digitizing 85 the output response signal to produce digital data and processing 86 the digital data thereby producing measured results.

Moreover, the method of measuring 300 of the present invention provides for the determination of the frequencies of the reference carrier frequency, the variable carrier frequency and the modulation frequency. Specifically, according to the method of measuring of the present invention, a sampling frequency, $f_s$, of the step of sampling 84 preferably determines the carrier frequency $f_r$ of the reference frequency modulated signal through the application of equation (vI). As described hereinabove $f_r$ is again related to an output reference carrier frequency $f_{r,out}$ produced by the DUT as given by equation (i) and where $f_{r,out}$ is related to $f_r$ as $f_{out}$ is related to $f_{in}$ and where L is a frequency translation inherent in the DUT as is the choice of "+" or "−", and where N is a fast Fourier transform (FFT) size used by an FFT performed by the signal processor and G is a small integer. Furthermore, the variable carrier frequency $f_v$ of the variable frequency modulated signal of each of the sequence of pairs of signals is determined by equation (vii) and equation (viii) also as described hereinabove. Once again, $f_v$ is related to $f_v$, out as $f_{in}$ is related to $f_{out}$ in equation (i).

Furthermore, the method of measuring 300 provides for the step of signal processing 86 to include but not be limited to the processing associated with equations (xiv) through xxviii). In particular, the method of measuring 300 of the present invention provides for the step of processing 86 wherein calculation of a normalized group delay $\hat{\tau}_N(\omega_v)$ as a function of frequency is accomplished by applying equation (xix) as described hereinabove.

Thus there has been disclosed a new, signal transfer characteristic measurement system and method with high precision and predictable accuracy. Changes and modifications may be made to the invention that may be readily apparent to those skilled in the art without going beyond the intended scope of the invention, as defined by the appended claims.

What is claimed is:

1. A system for measuring the signal transfer characteristics of a device under test (DUT) having an analog input port and an analog output port comprising:

a stimulus waveform generator that produces a stimulus waveform, the stimulus waveform comprising a time sequence of pairs of narrow bandwidth, modulated signals, wherein the stimulus waveform is applied to the input port of the device under test, thereby producing an output response signal at the output port of the device under test;

an analog-to-digital converter (ADC) for digitizing the output response signal and producing digital data; and a signal processor for processing the digital data, thereby producing measured results, wherein each pair of signals of the sequence of pairs of narrow bandwidth, modulated signals comprises a reference frequency modulated signal, and a variable frequency modulated signal, wherein the reference frequency modulated signal is a double sideband, suppressed carrier, modulated signal having a reference carrier frequency, the reference frequency modulated signal being modulated by a low frequency modulation signal, the low frequency modulated signal being a sine wave, wherein the variable frequency modulated signal is a double sideband, suppressed carrier, modulated signal having a variable carrier frequency, the variable frequency modulated signal being modulated by the low frequency modulation signal, and the variable carrier frequency being variable from pair to pair in the sequence of pairs, and wherein the stimulus waveform generator comprises:
  a reference frequency signal generator that generates a reference frequency output signal;
  a low frequency modulation signal generator that produces a low frequency sine wave;
  a variable frequency signal generator that generates a variable frequency output signal;
  a signal splitter for splitting the low frequency sine wave signal into a first copy and a second copy;
  a first double sideband modulator and a second double sideband modulator each having a first input, a second input and an output, wherein the first copy of the sine wave signal is applied to the first input of the first double sideband modulator and the second copy of the sine wave signal is applied to the first input of the second double sideband modulator;
  wherein the reference frequency output signal is applied to the second input of the first double sideband modulator, such that a modulated reference frequency signal is produced at the output of the first double sideband modulator, the modulated reference frequency signal being modulated by the low frequency sine wave signal, and
  wherein the variable frequency output signal is applied to the second input of the second double sideband modulator such that a modulated variable frequency signal is produced at the output of the second double sideband modulator, the modulated variable frequency signal being modulated by the low frequency sine wave signal; and
  a signal combiner, wherein the modulated reference frequency signal and the modulated variable frequency signal are combined by the signal combiner to produce the stimulus waveform.

2. A system for measuring the signal transfer characteristics of a device under test (DUT) having an analog input port and an analog output port comprising:
  a stimulus waveform generator that produces a stimulus waveform, the stimulus waveform comprising a time sequence of pairs of narrow bandwidth, modulated signals, wherein the stimulus waveform is applied to the input port of the device under test, thereby producing an output response signal at the output port of the device under test;
  an analog-to-digital converter (ADC) for digitizing the output response signal and producing digital data; and
  a signal processor for processing the digital data, thereby producing measured results,
  wherein each pair of signals of the sequence of pairs of narrow bandwidth, modulated signals comprises a reference frequency modulated signal, and a variable frequency modulated signal,
  wherein the reference frequency modulated signal is a double sideband, suppressed carrier, modulated signal having a reference carrier frequency, the reference frequency modulated signal being modulated by a low frequency modulation signal, the low frequency modulation signal being a sine wave,
  wherein the variable frequency modulated signal is a double sideband, suppressed carrier, modulated signal having a variable carrier frequency, the variable frequency modulated signal being modulated by the low frequency modulation signal, and the variable carrier frequency being variable from pair to pair in the sequence of pairs, and wherein a sampling frequency, $f_s$, of the ADC determines the reference carrier frequency $f_r$ of the reference frequency modulated signal through the application of $$f_{r,out} = \frac{f_s}{N}\left(\frac{N}{4} + G\right)$$

where $f_r$ is related to an output reference carrier frequency $f_{r,out}$ produced by the DUT as described by $$f_{out} = L \pm f_{in}$$

where $f_{r,out}$ is related to $f_r$ as $f_{out}$ is related to $f_{in}$ and where L is a frequency translation inherent in the DUT as is the choice of "+" or "−", and where N is a fast Fourier transform (FFT) size used by an FFT performed by the signal processor and G is a small integer, and wherein the variable carrier frequency $f_v$ of the variable frequency modulated signal of each of the sequence of pairs of signals is determined by $$f_{v,out}(k) = \left(kS + \frac{S}{2}\right)\frac{f_s}{N}$$

where k is an index of the pair of signals in the sequence given by $$k = 0, 1, \ldots \left(\frac{N}{2S} - 1\right)$$

and where S is an integer number of frequency cells between frequency steps across a band of interest of the DUT and where $f_v$ is related to $f_{v,out}$ as $f_{in}$ is related to $f_{out}$.

3. The system for measuring of claim 2 wherein the stimulus waveform generator is an arbitrary waveform generator.

4. The system for measuring of claim 2, wherein a normalized group delay $\hat{\tau}_N(\omega_V)$ as a function of frequency that is calculated from the measured results by the signal processor by applying $$\hat{\tau}_N(\omega_V) = \hat{\tau}_V - \hat{\tau}_R$$

$$= \frac{1}{2\omega_M}(\text{angle}(FY(\omega_{YH})) \cdot \text{conj}(FY(\omega_{VL})) -$$

$$\text{angle}(FY(\omega_{RH})) \cdot \text{conj}(FY(\omega_{RL})))$$

wherein FY is an FFT of the N time samples and wherein conj(·) means complex conjugate of an argument and angle (·) means the phase angle of the complex argument.

5. The system for measuring of claim 2, wherein the stimulus waveform further comprises a short duration synchronization pulse inserted immediately preceding each of the pairs of signals wherein the synchronization pulse is a sine wave pulse and wherein the presence of the synchronization pulse is used to trigger the analog-to-digital converter.

6. A system for measuring the signal transfer characteristics of a device under test having an analog input port and a digital output port comprising:
  a stimulus waveform generator that produces a stimulus waveform, the stimulus waveform comprising a sequence of pairs of narrow bandwidth, modulated signals, wherein the stimulus waveform is applied to the input port of the device under test, thereby producing an output signal at the output port of the device under test; and a signal processor for processing the digital data, thereby producing measured results, wherein each pair of signals of the sequence of pairs of narrow bandwidth, modulated signals comprises a reference frequency modulated signal, and a variable frequency modulated signal, wherein the reference frequency modulated signal is a double sideband, suppressed carrier, modulated signal having a reference carrier frequency, the reference frequency modulated signal being modulated by a low frequency modulation signal, the low frequency modulation signal being a sine wave, and wherein the variable frequency modulated signal is a double sideband, suppressed carrier, modulated signal having a variable carrier frequency, the variable frequency modulated signal being modulated by the low frequency modulation signal, the variable carrier frequency being variable from pair to pair in the sequence of pairs, and wherein a sampling frequency, $f_s$, of the device under test determines the reference carrier frequency $f_r$ of the reference frequency modulated signal through the application of $$f_{r,out} = \frac{f_s}{N}\left(\frac{N}{4} + G\right)$$

where $f_r$ is related to an output reference carrier frequency $f_{r,out}$ produced by the device under test as described by $$f_{out} = L \pm f_{in}$$

where $f_{r,out}$ is related to $f_r$ as $f_{out}$ is related to $f_{in}$ and where L is a frequency translation inherent in the device under test as is the choice of "+", and where N is a fast Fourier transform (FFT) size used by an FFT performed by the signal processor and G is a small integer, and wherein the variable carrier frequency $f_v$ of the variable frequency modulated signal of each of the sequence of pairs of signals is determined by $$f_{v,out}(k) = \left(kS + \frac{S}{2}\right)\frac{f_s}{N}$$

where k is an index of the pair of signals in the sequence given by $$k = 0, 1, \ldots \left(\frac{N}{2S} - 1\right)$$

and where S is an integer number of frequency cells between frequency steps across a band of interest of the DUT and where $f_v$ is related to $f_{v,out}$ as $f_{in}$ is related to $f_{out}$.

7. The system for measuring of claim 6, wherein the stimulus waveform generator is an arbitrary waveform generator.

8. The system for measuring of claim 6 wherein the stimulus waveform further comprises a short duration synchronization pulse inserted immediately preceding each of the pairs of signals wherein the synchronization pulse is a sine wave pulse and wherein the presence of the synchronization pulse is used to trigger the analog-to-digital converter.

9. The system for measuring of claim 6 wherein a normalized group delay $\hat{\tau}_N(\omega_V)$ as a function of frequency is calculated from the measured results by the signal processor by applying $$\hat{\tau}_N(\omega_V) = \hat{\tau}_V - \hat{\tau}_R$$
$$= \frac{1}{2\omega_M}(\text{angle}(FY(\omega_{VH})) \cdot \text{conj}(FY(\omega_{VL})) - $$
$$\text{angle}(FY(\omega_{RH})) \cdot \text{conj}(FY(\omega_{RL})))$$

wherein FY is an FFT of the N time samples and wherein conj($\cdot$) means complex conjugate of an argument and angle ($\cdot$) means the phase angle of the complex argument.

10. A method for measuring signal transfer characteristics of a device under test (DUT) having all input port and an output port comprising the steps of:

generating a stimulus waveform, the stimulus waveform comprising a time sequence of pairs of narrowband modulated signals, each of the pairs comprising a reference frequency modulated signal, and a variable frequency modulated signal, wherein the reference frequency modulated signal is a double sideband, suppressed carrier, modulated signal having a reference carrier frequency modulated by a low frequency modulation signal, and wherein the variable frequency modulated signal is a double sideband, suppressed carrier, modulated signal having a variable carrier frequency modulated by the low frequency modulation signal, the variable carrier frequency being variable from pair to pair in the sequence of pairs;

applying the stimulus waveform to the input port of the DUT such that an output response signal is generated at the output port of the DUT;

sampling and digitizing the output response signal to produce digital data; and processing the digital data, thereby producing measured results, wherein a sampling frequency, $f_s$, of the step of sampling determines the reference carrier frequency $f_r$ of the reference frequency modulated signal through the application of $$f_{r,out} = \frac{f_s}{N}\left(\frac{N}{4} + G\right)$$

where $f_r$ is related to an output reference carrier frequency $f_{r,out}$ produced by the DUT as described by $$f_{out} = L \pm f_{in}$$

where $f_{r,out}$ is related to $f_r$ as $f_{out}$ is related to $f_{in}$ and where L is a frequency translation inherent in the DUT as is the choice of "+" or "−", and where N is a fast Fourier transform (FFT) size used by an FFT performed by the signal processor and G wherein the variable carrier frequency $f_v$ of the variable frequency modulated signal of each of the sequence of pairs of signals is determined by $$f_{v,out}(k) = \left(kS + \frac{S}{2}\right)\frac{f_s}{N}$$

where k is an index of the pair of signals in the sequence given by $$k = 0, 1, \ldots \left(\frac{N}{2S} - 1\right)$$

and where S is an integer number of frequency cells between frequency steps across a band of interest of the DUT and where $f_v$ is related to $f_{v,out}$ as $f_{in}$ is related to $f_{out}$.

11. The method for measuring of claim 10 wherein the step of processing comprises the step of calculating a normalized group delay $\tau_N(\omega_V)$ as a function of frequency by applying $$\begin{aligned}\hat{\tau}_N(\omega_V) &= \hat{\tau}_V - \hat{\tau}_R \\ &= \frac{1}{2\omega_M}(\text{angle}(FY(\omega_{VH})) \cdot \text{conj}(FY(\omega_{VL})) - \\ &\quad \text{angle}(FY(\omega_{RH})) \cdot \text{conj}(FY(\omega_{RL})))\end{aligned}$$

wherein FY is an FFT of the N time samples and wherein conj(·) means complex conjugate of an argument and angle (·) means the phase angle of the complex argument.

* * * * *